US012354953B2

(12) United States Patent
Liaw

(10) Patent No.: US 12,354,953 B2
(45) Date of Patent: Jul. 8, 2025

(54) VIA STRUCTURES

(71) Applicant: Taiwan Semiconductor Manufacturing Company, Ltd., Hsin-Chu (TW)

(72) Inventor: Jhon Jhy Liaw, Hsinchu County (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 306 days.

(21) Appl. No.: 17/389,631

(22) Filed: Jul. 30, 2021

(65) Prior Publication Data

US 2023/0035444 A1    Feb. 2, 2023

(51) Int. Cl.
| | | |
|---|---|---|
| *H01L 23/528* | (2006.01) | |
| *H01L 21/02* | (2006.01) | |
| *H01L 21/768* | (2006.01) | |
| *H01L 23/522* | (2006.01) | |
| *H01L 23/532* | (2006.01) | |
| *H01L 23/535* | (2006.01) | |

(Continued)

(52) U.S. Cl.
CPC ...... *H01L 23/5283* (2013.01); *H01L 21/0259* (2013.01); *H01L 21/76805* (2013.01); *H01L 21/76816* (2013.01); *H01L 21/76895* (2013.01); *H01L 23/5226* (2013.01); *H01L 23/53242* (2013.01); *H01L 23/535* (2013.01); *H10D 30/031* (2025.01); *H10D 30/6729* (2025.01); *H10D 30/6735* (2025.01); *H10D 30/6757* (2025.01); *H10D 62/118* (2025.01); *H10D 64/017* (2025.01)

(58) Field of Classification Search
CPC .......... H01L 29/0673; H01L 29/42392; H01L 29/66787; H01L 29/78696; H01L 21/28587–28593; H01L 23/49838–49844; H10D 30/501–509; H10D 30/43–435; H10D 62/119–123; H10D 30/014; H10D 64/20–529; Y10S 977/938
See application file for complete search history.

(56) References Cited

U.S. PATENT DOCUMENTS 8,952,547 B2 * 2/2015 Liaw .................... H01L 21/768
257/775
9,564,433 B2    2/2017 Liaw
(Continued)

*Primary Examiner* — Eric A. Ward
*Assistant Examiner* — Nora T. Nix
(74) *Attorney, Agent, or Firm* — Cooper Legal Group, LLC

(57) ABSTRACT

A device includes a substrate having a top surface, a fin extending lengthwise along a first direction, a source feature and a drain feature, a gate structure having a gate stack extending along a second direction perpendicular to the first direction and interposing between the source and drain features, a gate via directly disposed on the gate stack, a source via electrically connecting the source feature, and a drain via electrically connecting the drain feature. The fin includes a stack of channel layers engaged by the gate stack. The source via has a first dimension along the second direction and a second dimension along the first direction, the drain via feature has a third dimension along the second direction and a fourth dimension along the first direction. A ratio of the first dimension to the second dimension is greater than a ratio of the third dimension to the fourth dimension.

20 Claims, 18 Drawing Sheets

(51) Int. Cl.
*H10D 30/01* (2025.01)
*H10D 30/67* (2025.01)
*H10D 62/10* (2025.01)
*H10D 64/01* (2025.01)

(56) References Cited

U.S. PATENT DOCUMENTS

| | | |
|---|---|---|
| 9,613,953 B2 | 4/2017 | Liaw |
| 9,793,273 B2 | 10/2017 | Liaw |
| 9,805,985 B2 | 10/2017 | Liaw |
| 2012/0001232 A1* | 1/2012 | Liaw ................. G11C 17/12 257/E27.059 |
| 2015/0332962 A1* | 11/2015 | Chen ............... H01L 21/76829 438/653 |
| 2019/0067131 A1* | 2/2019 | Liaw .................... H10D 84/038 |
| 2020/0105761 A1* | 4/2020 | Liaw .................... H10D 84/853 |
| 2022/0199797 A1* | 6/2022 | Naskar ............... H01L 29/0847 |

* cited by examiner

VIA STRUCTURES

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the nano-sheet-based device, which includes a gate structure that can extend, partially or fully, around a channel layer and between adjacent channel layers to provide access to the channel layer on at least two sides. Nano-sheet-based devices enable aggressive scaling down of IC technologies, maintaining gate control and mitigating SCEs, while seamlessly integrating with conventional IC manufacturing processes. As nano-sheet-based devices continue to scale, challenges have arisen as to balancing the need for a reduced leakage current with that for an increased routing efficiency. Such challenges impede the overall optimization of device performances and increase processing complexity. Accordingly, although existing devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
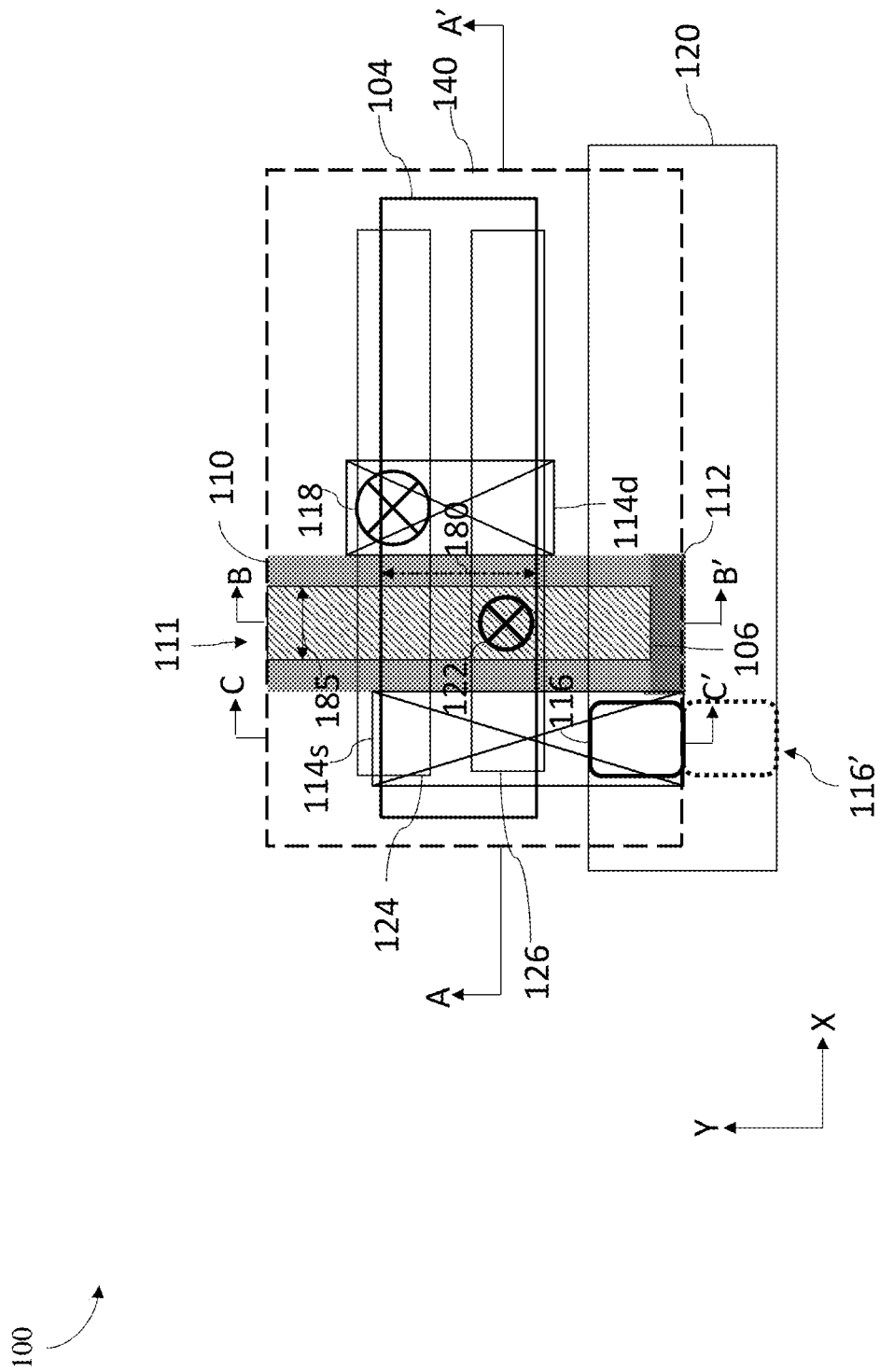
FIGS. 1A, 1E, 1F, 2A, 3A, 4 are plan views of nano-sheet based devices, in portion or entirety, according to some embodiments of the present disclosure.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used herein for ease of description to describe one element or feature's relationship to another element(s) or feature(s). The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly.

The present disclosure relates generally to integrated circuit devices, and more particularly, to multigate devices, such as nano-sheet-based devices. A nano-sheet-based device includes any device that has a stack of suspended channel layers (and, in some embodiments, only one suspended channel layer) that are at least partially surrounded by a gate structure. Nano-sheet-based devices include gate-all-around (GAA) devices, multi-bridge-channel (MBC) devices, and other similar devices. Furthermore, the nano-sheet-based devices may include channel layers of any suitable shapes and/or configurations. For example, the channel layers may be in one of many different shapes, such as wire (or nanowire), sheet (or nanosheet), bar (or nano-bar), and/or other suitable shapes. In other words, the term nano-sheet-based devices broadly encompasses devices having channel layers in nanowire, nano-bars, and any other suitable shapes. The nano-sheet based devices presented herein may be a complementary metal-oxide-semiconductor (CMOS) device, a p-type metal-oxide-semiconductor (PMOS) device, or an n-type metal-oxide-semiconductor (NMOS) device. Further, the channel layers of the nano-sheet-based devices may engage with a single, contiguous gate structure, or multiple gate structures. One of ordinary skill may recognize other examples of semiconductor devices that may benefit from aspects of the present disclosure. For example, other types of metal-oxide semiconductor field effect transistors (MOSFETs), such as planar MOSFETs, FinFETs, or other multi-gate FETs may benefit from the present disclosure.

As scale-down continues and the feature dimensions continue to shrink, it has become more and more challenging to increase metal line packing density while maintaining or reducing the resistance and device integrity. For example, as the metal line density increases, the spaces available to form conductive features (such as vias and/or contacts) shrink, which is often coupled with the increase in resistances. How to alleviate such resistance increase without impeding with the scale-down has become a major quest of the area. Moreover, the increased line densities also lead to the risk of leakage or shorting between adjacent conductive features. For example, in order to maximize the metal line density, it may be beneficial to route certain metal lines (such as a word line that electrically connects to a transistor gate through a gate via) over (or partially over) the active region. In some approaches, the gate stack to which the gate via connects is sandwiched between a pair of epitaxial source/drain features. The gate via, therefore, is also sandwiched between source/drain contacts located on the epitaxial source/drain features, or source/drain vias located on the source/drain contacts. The close proximity of the gate via from those other conductive features causes concerns over inadvertent shorting. To avoid such risks, designers may be forced to choose between packing density and low leakage and/or between packing density and low resistance. As scale-down continues and as the routing efficiency rise as a major concern, such restrictions have become increasingly problematic. Accordingly, this present disclosure provides schemes and methods that minimize feature resistances and mitigate the shorting concerns while also allowing maximized metal line density. As a result, device performances are improved.

Figure 1B:
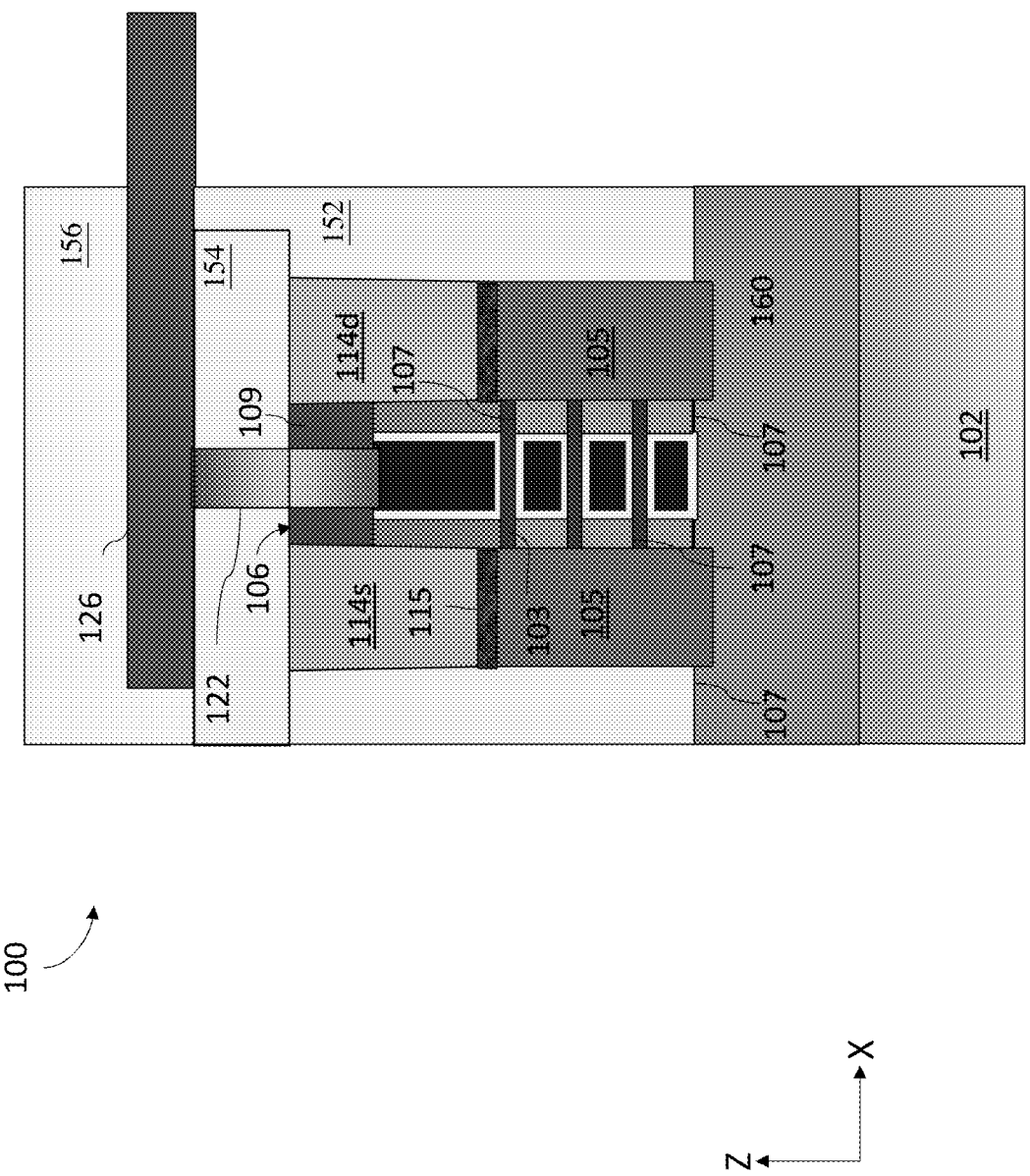
FIGS. 1B, 2B, 3B are fragmentary diagrammatic views of the nano-sheet based devices along the A-A' line of FIG. 1A, 2A, 3A, respectively, in portion or entirety, according to some embodiments of the present disclosure.
Figure 1C:
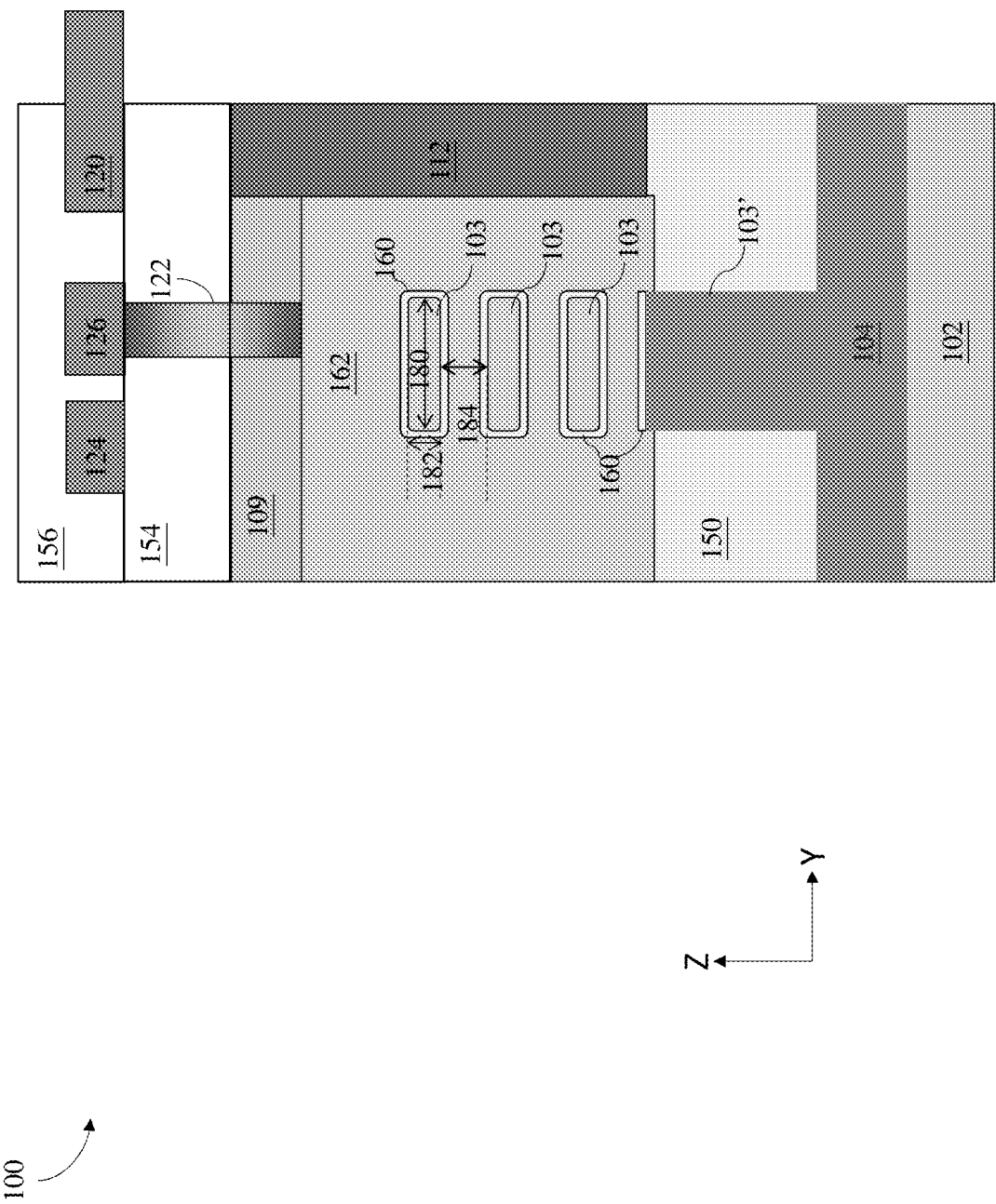
FIGS. 1C, 2C, 3C are fragmentary diagrammatic views of the nano-sheet based devices along the B-B' line of FIG. 1A, 2A, 3A, respectively, in portion or entirety, according to some embodiments of the present disclosure.
Figure 1D:
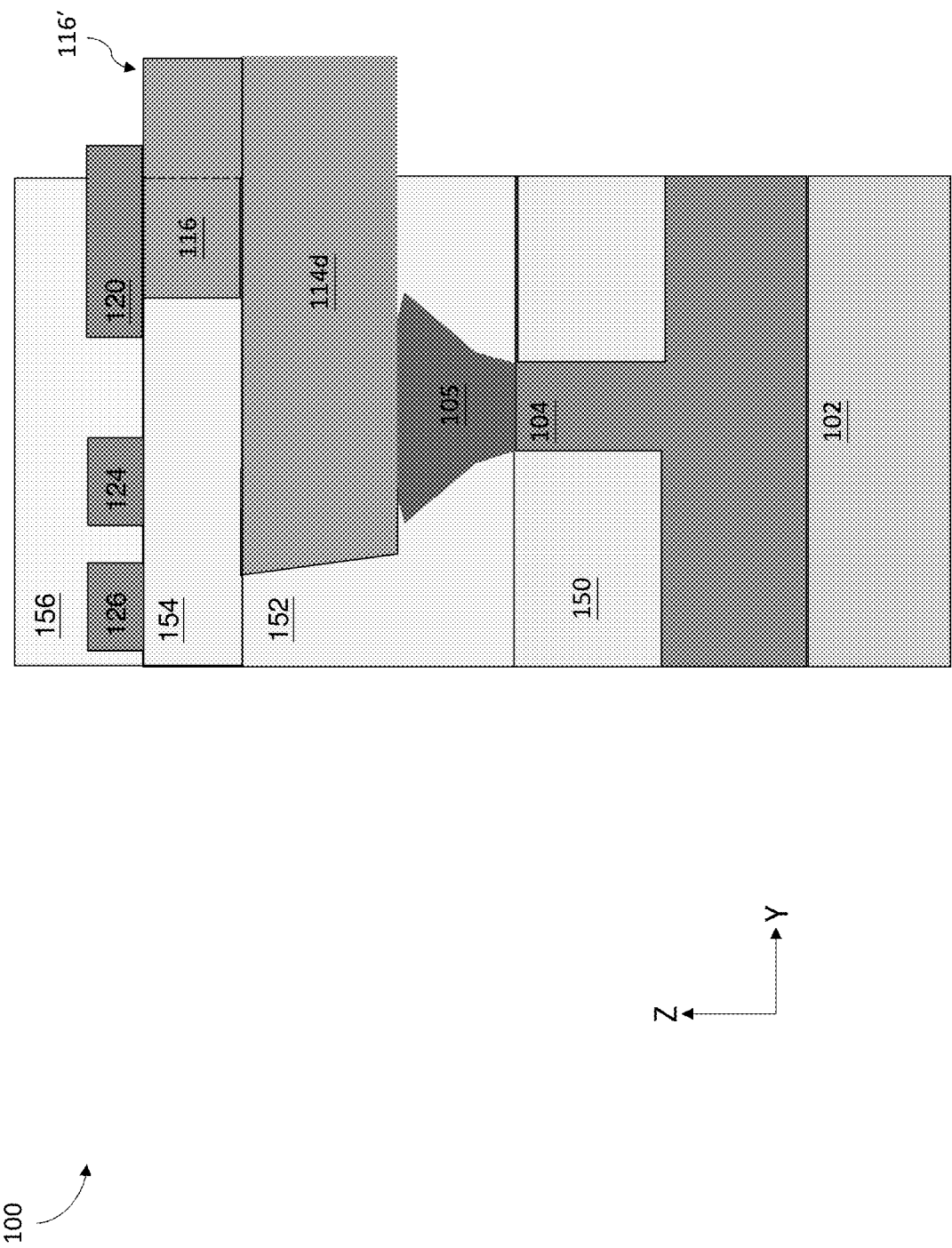
FIGS. 1D, 2D, 3D are fragmentary diagrammatic views of the nano-sheet based devices along the C-C' line of FIG. 1A, 2A, 3A, respectively, in portion or entirety, according to some embodiments of the present disclosure.

FIG. 1A is a plan view of a nano-sheet based device 100 (or device 100), in portion or entirety, according to some embodiments of the present disclosure. FIG. 1B is a fragmentary diagrammatic view of the device 100 along the A-A' line of FIG. 1A; FIG. 1C is a fragmentary diagrammatic view of the device 100 along the B-B' line of FIG. 1A; and FIG. 1D is a fragmentary diagrammatic view of the device 100 along the C-C' line of FIG. 1A.

Referring to FIGS. 1A-1D, the device 100 includes a substrate (wafer) 102. In the depicted embodiment, substrate 102 includes silicon. Alternatively or additionally, substrate 102 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as SiGe, SiPC, GaAsP, AlInAs, AlGaAs, GaInAs, GaInP, and/or GaInAsP; or combinations thereof. Alternatively, substrate 102 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Substrate 102 includes various substrate regions, such as substrate region 140. In some embodiments, the substrate region may be doped thus may interchangeably referred to as doped regions, such as the doped region 140. The doped region 140 may be an n-type doped region (also referred to as an n-well, such as when the device 100 is configured as a PMOS transistor) or a p-type doped region (also referred to as p-well, such as when the device 100 is configured as an NMOS transistor). N-type doped regions may be doped with n-type dopants, such as phosphorus, arsenic, other n-type dopant, or combinations thereof. P-type doped regions may be doped with p-type dopants, such as boron (for example, $BF_2$), indium, other p-type dopant, or combinations thereof. In some implementations, the doped region 140 may be formed with a combination of p-type dopants and n-type dopants. The doped region 140 can be formed directly on and/or in substrate 102, for example, providing a p-well structure, an n-well structure, a dual-well structure, a raised structure, or combinations thereof. An ion implantation process, a diffusion process, and/or other suitable doping process can be performed to form the various doped regions. In some implementations, the doped region 140 has a dopant concentration of about $5\times10^{16}$ cm$^{-3}$ to about $5\times10^{19}$ cm$^{-3}$.

The device 100 includes an active region 104 disposed over the doped region 140 of the substrate 102. In some embodiments, the active region 104 is a fin active region 104 and therefore includes a fin structure and may be interchangeably referred to as a fin structure 104. The fin structure includes a base fin 103' extending lengthwise along the x-direction, and upwards along a z-direction from the substrate 102. The fin structure further includes a plurality of suspended channel layers 103 (or channel layers 103) overlaying the base fin 103'. In the depicted embodiment, base fin 103' extends above a top surface of isolation feature 150. However, in some embodiments, base fin 103' may extend to the top surface of isolation feature 150. Each channel layer 103 has a lateral width (or "channel width") 180 along the x-direction and a thickness 182 (or "channel thickness") along the z-direction. Channel layers 103 are separated vertically, along the z-direction, from each other by separation 184. In the depicted embodiment, each channel layer 103 has the same lateral width 180 and/or the same thickness 182 as one another. In some embodiments, the lateral width 180 may be about 6 nm to about 80 nm; and the thickness 182 is about 3 nm to about 10 nm. In some embodiments, channel layers 103 may have different lateral widths and/or different thicknesses from one another. In such embodiments, the lateral width 180 and the thickness 182 represent the average lateral width and average thickness, respectively. In the depicted embodiment, channel layers 103 also have the same lateral width as the base fin 103' that they overlay. In some embodiments, one or more dimensions of the channel layers 103 (such as lateral widths 180, and/or thickness 182) are within a nanometer regime (such as between 1 nm to 1 μm). Accordingly, the channel layers 103 may be considered a nanostructure, and may be interchangeably referred to as nanochannels. The channel layers 103 may be of any shape, such as wires, sheets, bars, other appropriate shapes, or combinations thereof. For example, the thickness of a channel layer 103 can be configured to define a desired distance (or gap) between adjacent channels of device 100 (e.g., between channel layers 103) where a gate electrode portion is disposed. Thickness of a channel layer 103 can be configured to achieve desired thickness of channels of device 100. Both thicknesses can be configured to achieve desired performance of device 100. In the depicted embodiment, the device 100 includes three channel layers 103 configured to form three channels for conductance in operation. However, the present disclosure contemplates embodiments where the device 100 includes more or fewer suspended channel layers 103, for example, depending on a number of channels desired for device 100 and/or design requirements of device 100. For example, there may be two to ten semiconductor layers 103.

Fin structure 104 is formed over substrate 102 using any suitable process, for example, nano-sheet-based device processing methods. In some implementations, a combination of deposition, lithography and/or etching processes are performed to define base fin 103' and channel layers 103. Base fin 103' may be formed from a portion of substrate 102, therefore having the same material as substrate 102. For example, base fin 103' and substrate 102 may both include silicon (Si). Channel layers 103 include a semiconductor material, such as Si, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In the depicted embodiment, channel layers 103 include silicon. Channel layers 103 may be formed from a material layer overlying substrate 102. In some implementations, the material layer includes alternating Si semiconductor layers and SiGe layers. During the processing, one of the alternating semiconductor layers (such as SiGe layers) are removed without substantially removing the other alternating semiconductor layers (such as Si layers), thereby creating a suspended structure. The remaining alternating semiconductor layers (such as Si layers) become the channel layers 103. As described hereinabove, the channel layers 103 are formed in the channel region interposing a source region and a drain region. Accordingly, channel layers 103 each interpose and connect a respective pair of source/drain features 105.

Isolation feature(s) 150 is formed over and/or in substrate 102 to isolate various regions, such as to isolate the active region 104 from adjacent active regions. For example, isolation feature 150 separates and isolates base fin 103' from adjacent base fins. In the depicted embodiment, isolation feature 150 surrounds base fin 103'. Isolation feature 150 includes silicon oxide, silicon nitride, silicon oxynitride, other suitable isolation material (for example, including silicon, oxygen, nitrogen, carbon, or other suitable isolation constituent), or combinations thereof. Isolation feature 150 can include different structures, such as shallow trench isolation (STI) structures, deep trench isolation (DTI) structures, and/or local oxidation of silicon (LOCOS) structures. In some implementations, STI features can be formed by etching a trench in substrate 102 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation feature 150. In some implementations, STI features can be formed by depositing an insulator material over substrate 102 after forming base fins 103', such that the insulator material layer fills gaps (trenches) between base fins 103', and etching back the insulator material layer to form isolation feature 150. In some implementations, isolation feature 150 includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation feature 150 includes a dielectric layer disposed over a doped liner layer (including, for example, boron silicate glass (BSG) or phosphosilicate glass (PSG)).

As noted, a gate structure 111 is disposed over active region 104 (such as over the stack of channel layers 103 in the channel region). Gate structure 111 extends along the y-direction (for example, substantially orthogonal to the lengthwise direction of the active region 104. The gate structure 111 defines a channel region of the active region 104 (which accommodates the channel layers 103) and determines the length of the channel layers 103 along the y-direction. The gate structure 111 also defines a source region and a drain region (generally and collectively referred to as source/drain regions) on both sides of the channel region. Gate structure 111 engages and wraps the stack of channel layers 103, such that current can flow between the source/drain regions during operation. Gate structure 111 includes gate dielectrics 160, gate electrode 162, gate top hard mask 109, and gate end dielectric layer 112. The gate dielectric 160 and the gate electrode 162 are collectively referred to as the gate stack 106. In the depicted embodiments, the gate stack 106 has a dimension 185 along the x-direction. In some embodiments, the dimension 185 is about 5 nm to about 30 nm. In some embodiments, the dimension 185 is about 8 nm to about 20 nm. If the dimension 185 is too small, such as less than 5 nm, the short channel effect (SCE) may be too significant; if the dimension 185 is too large, such as greater than 30 nm, it may impede the overall goal of down-scaling.

The gate stack 106 is fabricated according to a gate last process, a gate first process, or a hybrid gate last/gate first process. In gate last process implementations, the gate structure 111 includes a dummy gate stack that is subsequently replaced with a metal gate stack. The dummy gate stack includes, for example, an interfacial layer (including, for example, silicon oxide) and a dummy gate electrode layer (including, for example, polysilicon). In such implementations, the dummy gate electrode layer is removed to form openings (trenches) in which gate dielectric 160 and gate electrode 162 are subsequently formed. Gate last processes and/or gate first processes can implement deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, e-beam writing, or ion-beam writing. The etching processes include dry etching processes, wet etching processes, other etching processes, or combinations thereof. A CMP process can be performed to remove any excess material of gate dielectrics 160, gate electrodes 162, and/or gate top hard mask layer 109, and planarizing gate structure 111.

Gate dielectric 160 is conformally disposed over and around respective channel layers 103 and over isolation feature 150, such that gate dielectric 160 have a substantially uniform thickness. In the depicted embodiment, gate dielectric 160 is disposed directly on each of the respective channel layers 103. Gate dielectric 160 include a dielectric material, such as silicon oxide, high-k dielectric material, other suitable dielectric material, or combinations thereof. In the depicted embodiment, gate dielectric 160 includes a high-k dielectric layer including, for example, hafnium, aluminum, zirconium, lanthanum, tantalum, titanium, yttrium, oxygen, nitrogen, other suitable constituent, or combinations thereof. In some implementations, the high-k dielectric layer includes $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. High-k dielectric material generally refers to dielectric materials having a high dielectric constant, for example, greater than that of silicon oxide (k≈3.9). In some implementations, gate dielectric 160 further includes an interfacial layer (including a dielectric material, such as silicon oxide) disposed between the high-k dielectric layer and the respective channel layers 103, and isolation feature 150.

Gate electrode 162 is disposed over gate dielectric 160. Gate electrode 162 includes an electrically conductive material. In some implementations, gate electrode 162 includes multiple layers, such as one or more capping layers, work function layers, glue/barrier layers, and/or metal fill (or bulk) layers. A capping layer can include a material that prevents or eliminates diffusion and/or reaction of constituents between gate dielectric 160 and other layers of gate structure 111 (in particular, gate layers including metal). In some implementation, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer can include a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu. Hard mask layer 109 is disposed over gate electrode 162 and includes any suitable material, such as silicon, nitrogen, and/or carbon (for example, silicon nitride or silicon carbide).

Gate structure 111 further includes respective gate spacers 110 disposed adjacent to (for example, along sidewalls of) the respective gate stacks 106. Gate spacers 110 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 102 and subsequently anisotropically etched to form gate spacers 110. In some implementations, gate spacers 110 include a multi-layer structure, such as a first dielectric layer that includes silicon nitride and a second dielectric layer that includes silicon oxide. In some implementations, gate spacers 110 include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 102 and subsequently anisotropically etched to form a first spacer set adjacent to the gate stacks, and a second dielectric layer including silicon and nitrogen can be deposited over substrate 102 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features before and/or after forming gate spacers 110. As described above, the gate stack 106 has a dimension 185 along the x-direction. Accordingly, the gate spacers 110 are separated from each other by a distance equal to the dimension 185. Additionally, the gate spacers 110 has a dimension 183 along the x-direction. In some embodiments, the dimension 183 is about 3 nm to about 12 nm. In some embodiments, the dimension 183 is about 4 nm to about 10 nm. If the dimension 183 is too small, such as less than 3 nm, subsequently formed source/drain features and/or contacts formed thereon may be too close to the gate stack thereby raising reliability concerns; if the dimension 183 is too large, such as greater than 12 nm, the formation area for the source/drain features (or the respective contacts) may be unnecessarily reduced.

Epitaxial source features and epitaxial drain features 105 (referred to as epitaxial source/drain features 105) are disposed over the source/drain regions of the active region 104, and inner spacers 107 are disposed between epitaxial source/drain features 105 and gate stack 106. For example, semiconductor material is epitaxially grown on base fin 103', forming epitaxial source/drain features 105. In the depicted embodiment, epitaxial source/drain features 105 each extend (grow) laterally along the y-direction (in some implementations, substantially perpendicular to the lengthwise direction of active region 104), such that epitaxial source/drain features 105 have a greater lateral width along the y-direction than base fins 103'. In some embodiments, epitaxial source/drain features are merged, such that they span more than one base fin structure. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of base fins 103'. Epitaxial source/drain features 105 may be doped with n-type dopants and/or p-type dopants. For example, epitaxial source/drain features 105 for an n-type transistor include an n-type dopant and are formed from epitaxial layers including silicon and/or carbon, where silicon-containing epitaxial layers or silicon-carbon-containing epitaxial layers are doped with phosphorous, arsenic, other n-type dopant, or combinations thereof (for example, forming a Si:P epitaxial layer, a Si:C epitaxial layer, or a Si:C:P epitaxial layer). Epitaxial source/drain features 105 for a p-type transistor include a p-type dopant and are formed from epitaxial layers including silicon and/or germanium, where the silicon germanium containing epitaxial layers are doped with boron, carbon, other p-type dopant, or combinations thereof (for example, forming a Si:Ge:B epitaxial layer or a Si:Ge:C epitaxial layer). In some implementations, epitaxial source/drain features 105 include materials and/or dopants that achieve desired tensile stress and/or compressive stress in the channel region. In some implementations, epitaxial source/drain features 105 are doped during deposition by adding impurities to a source material of the epitaxy process. In some implementations, epitaxial source/drain features 105 are doped by an ion implantation process subsequent to a deposition process.

In some implementations, annealing processes are performed to activate dopants in epitaxial source/drain features 105 and/or other source/drain regions, such as HDD regions and/or LDD regions. In some implementations, silicide layers 115 are formed on epitaxial source/drain features 105. In some implementations, silicide layers are formed by depositing a metal layer over epitaxial source/drain features 105. The metal layer includes any material suitable for promoting silicide formation, such as nickel, platinum, palladium, vanadium, titanium, cobalt, tantalum, ytterbium, zirconium, other suitable metal, or combinations thereof. The device 100 is then heated (for example, subjected to an annealing process) to cause constituents of epitaxial source/drain features 105 (for example, silicon and/or germanium) to react with the metal. The silicide layers thus include metal and a constituent of epitaxial source/drain features 105 (for example, silicon and/or germanium). In some implementations, the silicide layers include nickel silicide, titanium silicide, or cobalt silicide. Any un-reacted metal, such as remaining portions of the metal layer, is selectively removed by any suitable process, such as an etching process. In some implementations, the silicide layers and epitaxial source/drain features 105 are collectively referred to as the epitaxial source/drain features.

A multilayer interconnect (MLI) feature is disposed over substrate 102. MLI feature electrically couples various devices (for example, p-type transistors, n-type transistors, other transistors, resistors, capacitors, and/or inductors) and/or components (for example, gate structures 111 and/or source/drain features 105) of device 100, such that the various devices and/or components can operate as specified by design requirements of the device 100. MLI feature includes a combination of dielectric layers (such as interlayer dielectric (ILD) 152, ILD 154, and ILD 156) and electrically conductive layers (for example, source/drain contacts (or device-level contacts) 114s, 114d, source via 116, drain via 118, gate via 122, and metal lines 120, 124, 126) configured to form various interconnect structures. The conductive layers are configured to form vertical interconnect features (such as source/drain contacts, vias) and/or horizontal interconnect features (such as conductive lines). Vertical interconnect features typically connect horizontal interconnect features in different layers (or different planes) of MLI feature. During operation of the device 100, the interconnect features are configured to route signals between the devices and/or between components of the device 100 and/or distribute signals (for example, clock signals, voltage signals, and/or ground signals) to the devices and/or the components of the device 100. It is noted that though MLI feature is depicted with a given number of dielectric layers and conductive layers, the present disclosure contemplates MLI feature having more or fewer dielectric layers and/or conductive layers.

As described above, MLI feature includes one or more dielectric layers, such as an ILD layer 152 (ILD-0) disposed over substrate 102, an ILD layer 154 (ILD-1) disposed over ILD layer 152, an ILD layer 156 (ILD-2), as well as additional ILD layers disposed over ILD layer 156 (not shown). ILD layers 152, 154, 156 include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK® (Dow Chemical, Midland, Mich.), polyimide, other low-k dielectric material, or combinations thereof. In the depicted embodiment, ILD layers 152, 154, 156 are dielectric layers that include a low-k dielectric material (generally referred to as low-k dielectric layers). In some implementations, low-k dielectric material generally refers to materials having a dielectric constant (k) that is less than 3. ILD layers 152, 154, 156 can include a multilayer structure having multiple dielectric materials. MLI feature can further include one or more contact etch stop layers (CESLs) disposed between ILD layers 152, 154, 156, such as a CESL disposed between ILD layer 152 and ILD layer 154, a CESL disposed between ILD layer 154 and ILD layer 156, a CESL disposed between ILD layer 156 and additional ILD layers (not shown). In some implementations, a CESL is disposed between substrate 102 and/or isolation feature 150 and ILD layer 152. CESLs include a material different than ILD layers 152, 154, 156, such as a dielectric material that is different than the dielectric material of ILD layers 152, 154, 156. For example, where ILD layers 152, 154, 156 include a low-k dielectric material, CESLs include silicon and nitrogen, such as silicon nitride or silicon oxynitride. ILD layers 152, 154, 156 are formed over substrate 102 by a deposition process, such as CVD, PVD, ALD, HDPCVD, MOCVD, RPCVD, PECVD, LPCVD, ALCVD, APCVD, plating, other suitable methods, or combinations thereof. In some implementations, ILD layers 152, 154, 156 are formed by a flowable CVD (FCVD) process that includes, for example, depositing a flowable material (such as a liquid compound) over substrate 102 and converting the flowable material to a solid material by a suitable technique, such as thermal annealing and/or ultraviolet radiation treating. Subsequent to the deposition of ILD layers 152, 154, 156, a CMP process and/or other planarization process is performed, such that ILD layers 152, 154, 156 have substantially planar surfaces.

Source contact 114s and drain contacts 114d (collectively, source/drain contacts) are disposed in the ILD layer 152 to form a part of MLI feature. Source/drain contacts 114s and 114d electrically couple and/or physically couple IC device features, such as features of p-type transistors and n-type transistors to other components of MLI feature, for example, source via 116 and drain via 118 of the MLI feature. For example, source/drain contacts 114s and 114d are metal-to-device (MD) contacts, which generally refer to contacts to a conductive region, such as source/drain regions, of a device. Source/drain contacts 114s and 114d extend through ILD layer 152, though the present disclosure contemplates embodiments where source/drain contacts 114s and 114d extend through more ILD layers and/or CESLs of MLI feature.

Source/drain contacts 114s and 114d include any suitable electrically conductive material, such as tantalum (Ta), titanium (Ti), aluminum (Al), copper (Cu), cobalt (Co), tungsten (W), ruthenium (Ru), titanium nitride (TiN), tantalum nitride (TaN), other suitable conductive materials, or combinations thereof. Various conductive materials can be combined to provide source/drain contacts 114s and 114d with various layers, such as a barrier layer, an adhesion layer, a liner layer, a bulk layer, other suitable layer, or combinations thereof. In some embodiments, the source/drain contacts 114s and/or 114d include pure W, Ru, or combinations thereof; and barrier layers, adhesion layers, liner layers, or bulk layers are not formed on the source/drain contacts 114s and/or 114d. For example, the source/drain contacts 114s and/or 114d directly contacts the ILD 152 without any intervening layers. In some embodiments, the absence of the barrier layers allows maximizing the size of the source/drain contacts, thereby minimizes the resistances therein. In some implementations, source/drain contacts 114s and 114d are formed by patterning ILD layer 152. Patterning ILD layer 152 can include lithography processes and/or etching processes to form openings (trenches), such as contact openings, in ILD layer 152. In some implementations, the lithography processes include forming a resist layer over ILD layer 152, exposing the resist layer to patterned radiation, and developing the exposed resist layer, thereby forming a patterned resist layer that can be used as a masking element for etching opening(s) in ILD layer 152. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of ILD layer 152 and a top surface of source/drain contacts 114s and 114d.

Conductive lines 120, 124, and 126 are formed to electrically couple and/or physically couple to various other devices and/or voltages. In the depicted embodiments, the conductive lines (or metal lines) 120, 124, and 126 extend along the x-direction and in parallel to the lengthwise direction of the active region 104. In one example, the metal line 120 is a power line (such as Vdd, Vss) coupled to the source feature 105 through the source via 116 and source contact 114s. In furtherance of the example, the metal line 124 may be a bit line coupled to the drain feature 105 through the drain via 118 and the drain contact 114d. Moreover, the metal line 126 may be a word line coupled to the gate stack 106 through the gate via 122. In the depicted embodiments, the conductive lines 120, 124, and 126 are formed in a same metal layer (such as a MO layer). Alternatively, the conductive lines 120, 124 and 126 may be formed in different metal layers. In some implementations, MLI feature further includes conductive lines that extend in a direction substantially orthogonal to the conductive lines 120, 124, and 126 to form a different metal layer. The present disclosure contemplates different configurations of source/drain contacts 114s and 114d, vias 116, 118, conductive lines 120, 124, and 126, and/or additional conductive features, depending on design requirements of the device 100. In the depicted embodiments, the metal lines 120 may be wider than the metal lines 124 along the y-direction. Generally, the resistances of the metal lines directly relate to the width of the metal lines. Resistances on the source side may have a larger impact on the device performances than the resistances on the drain features. Accordingly, it may be beneficial to increase the widths of the metal line 120 without increasing the widths of the metal line 124. Moreover, in some embodiments, one source feature may feed into two or more drain features. Such designs may require a higher voltage level and/or a higher current level on the source side as compared to the drain side, which may be achieved by, for example, using a wider metal line that feeds into the source feature (such as metal line 120) than that feeds into to drain feature (such as the metal line 124). The conductive lines may include any suitable electrically conductive material, such as Ta, Ti, Al, Cu, Co, W, Ru, TiN, TaN, other suitable conductive materials, or combinations thereof. In some embodiments, the metal lines include pure W, Ru, or combinations thereof; and barrier layers, adhesion layers, liner layers, or bulk layers are not formed on the conductive lines, such that the volume of the conductive lines are maximized, and resistances are minimized.

Figure 1E:
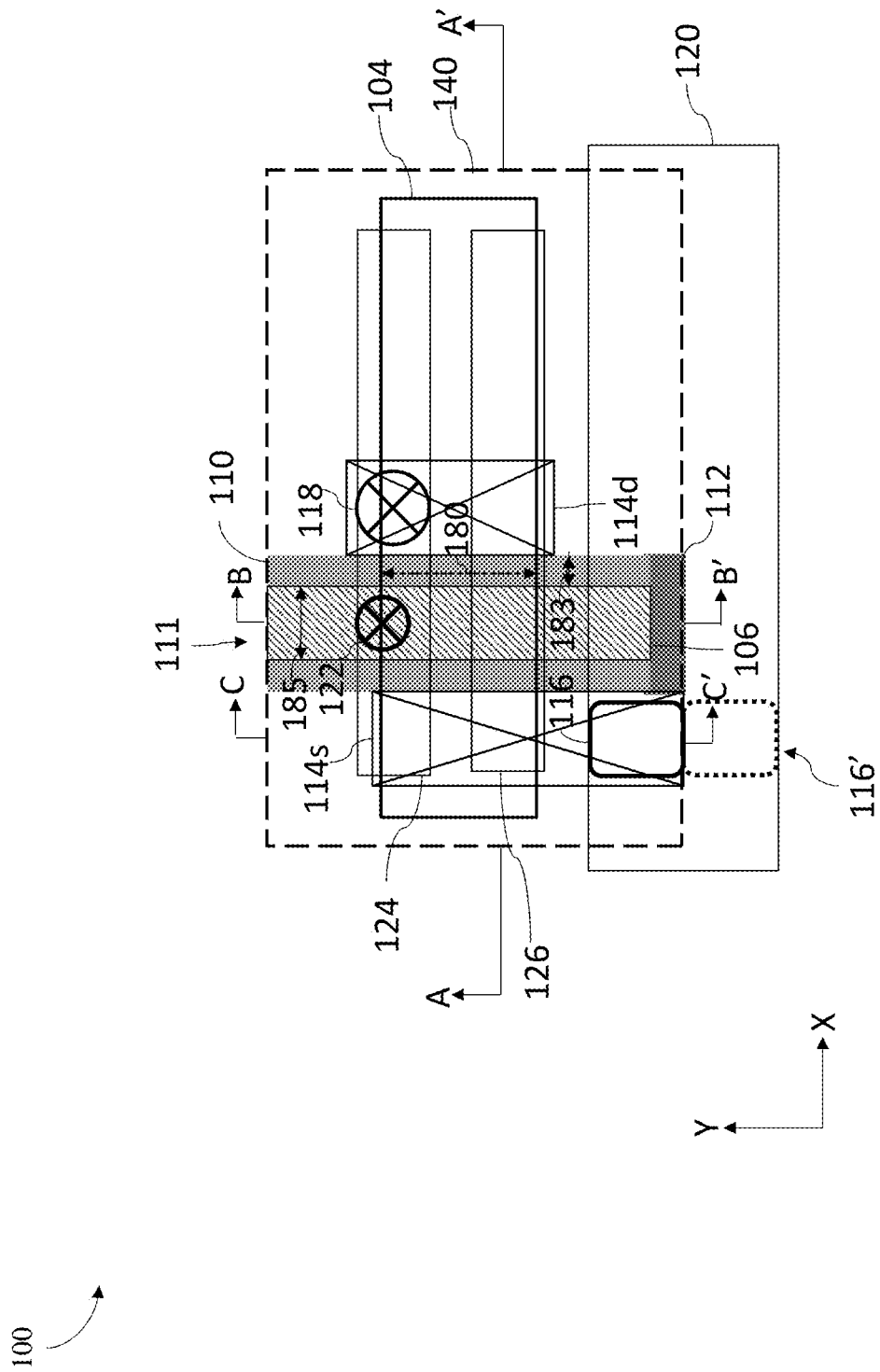
Figure 1F:
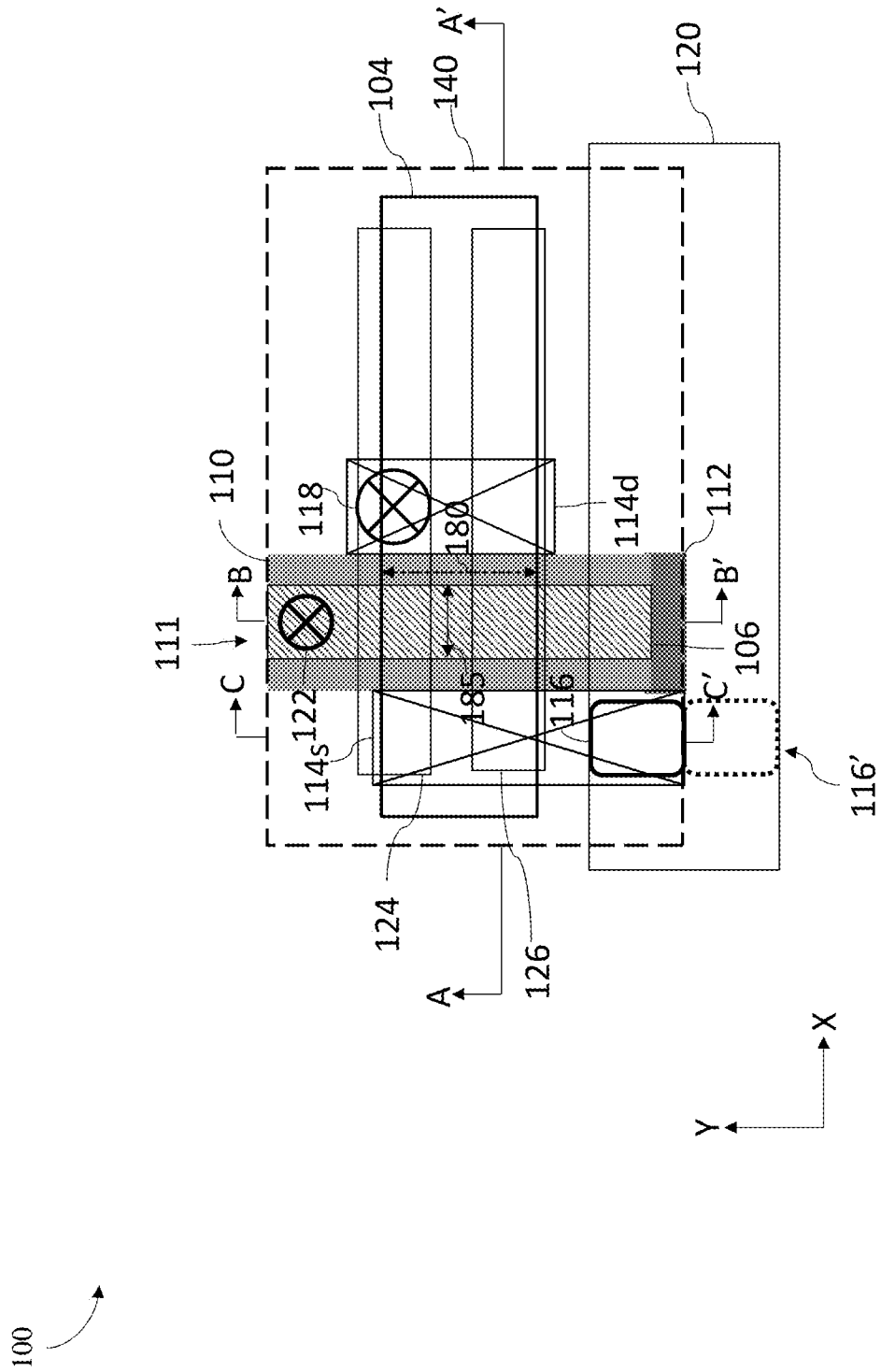
Figure 1G:
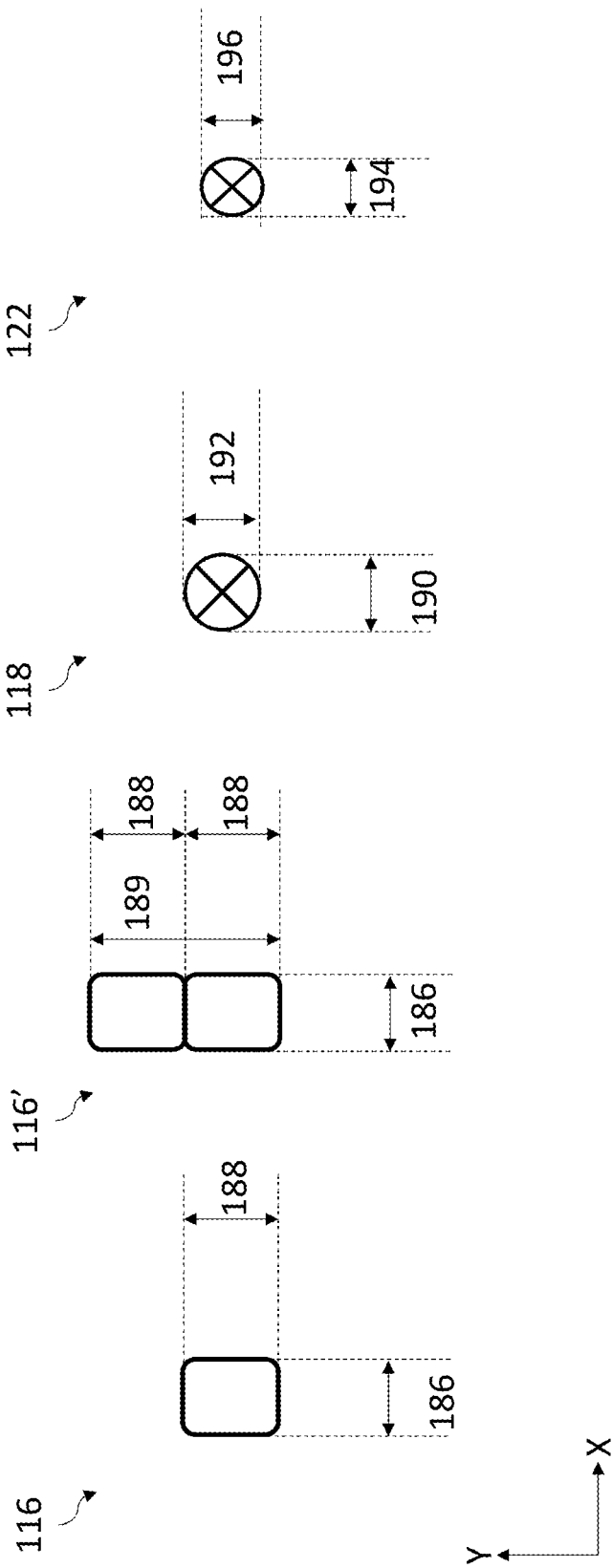
FIG. 1G is an expanded top view of via features of FIG. 1A according to some embodiments of the present disclosure.
Figure 2A:
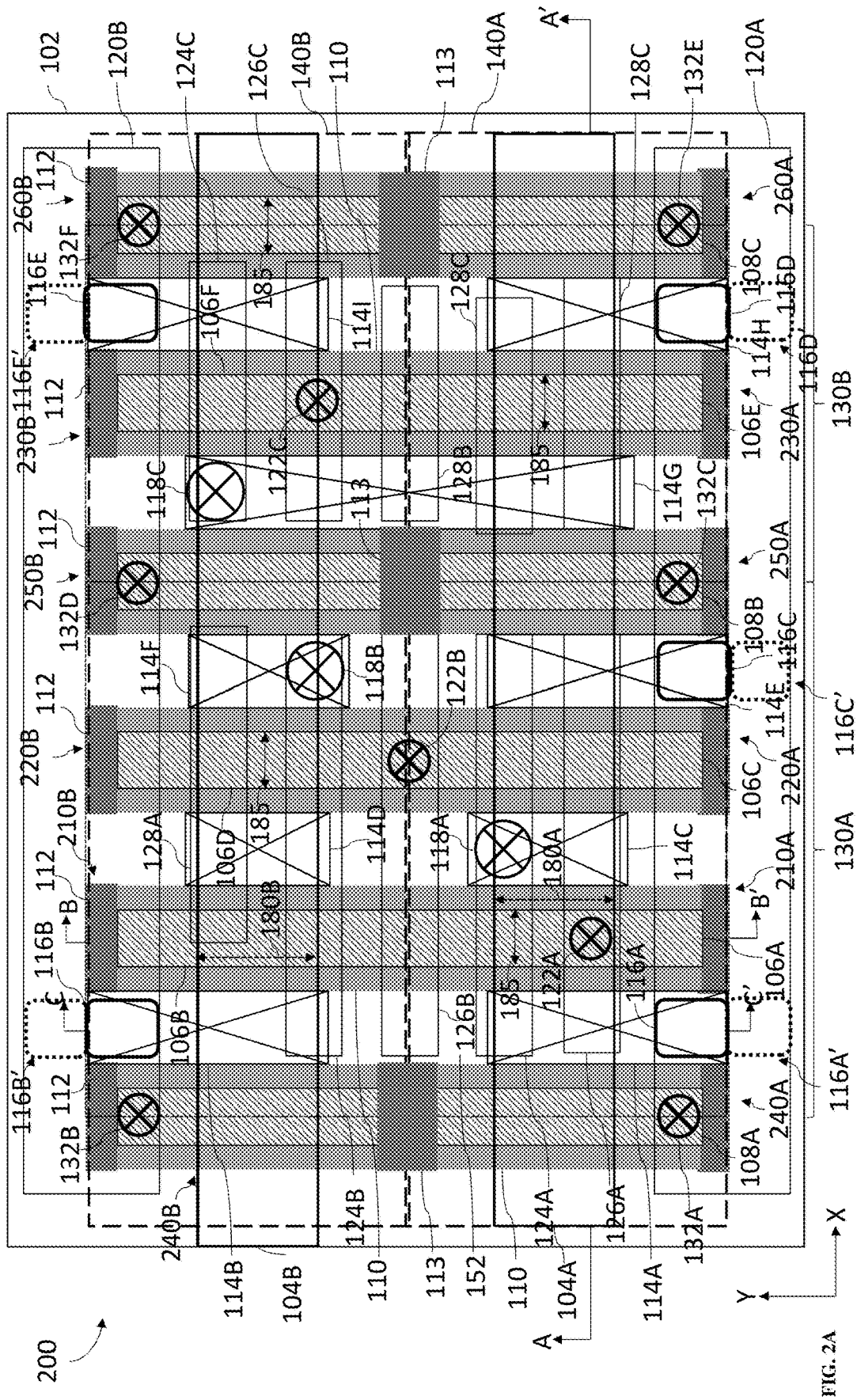
Figure 2B:
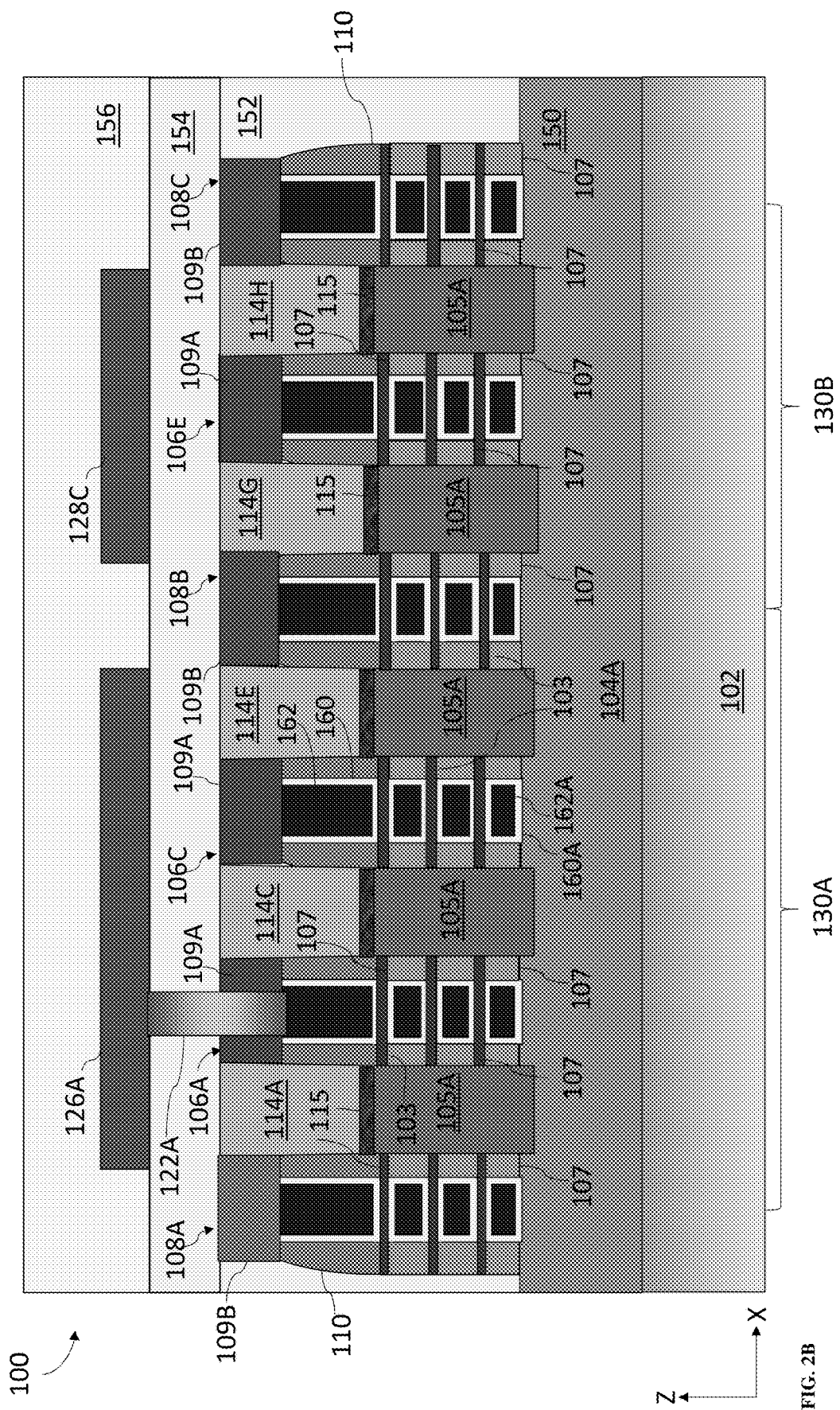
Figure 2C:
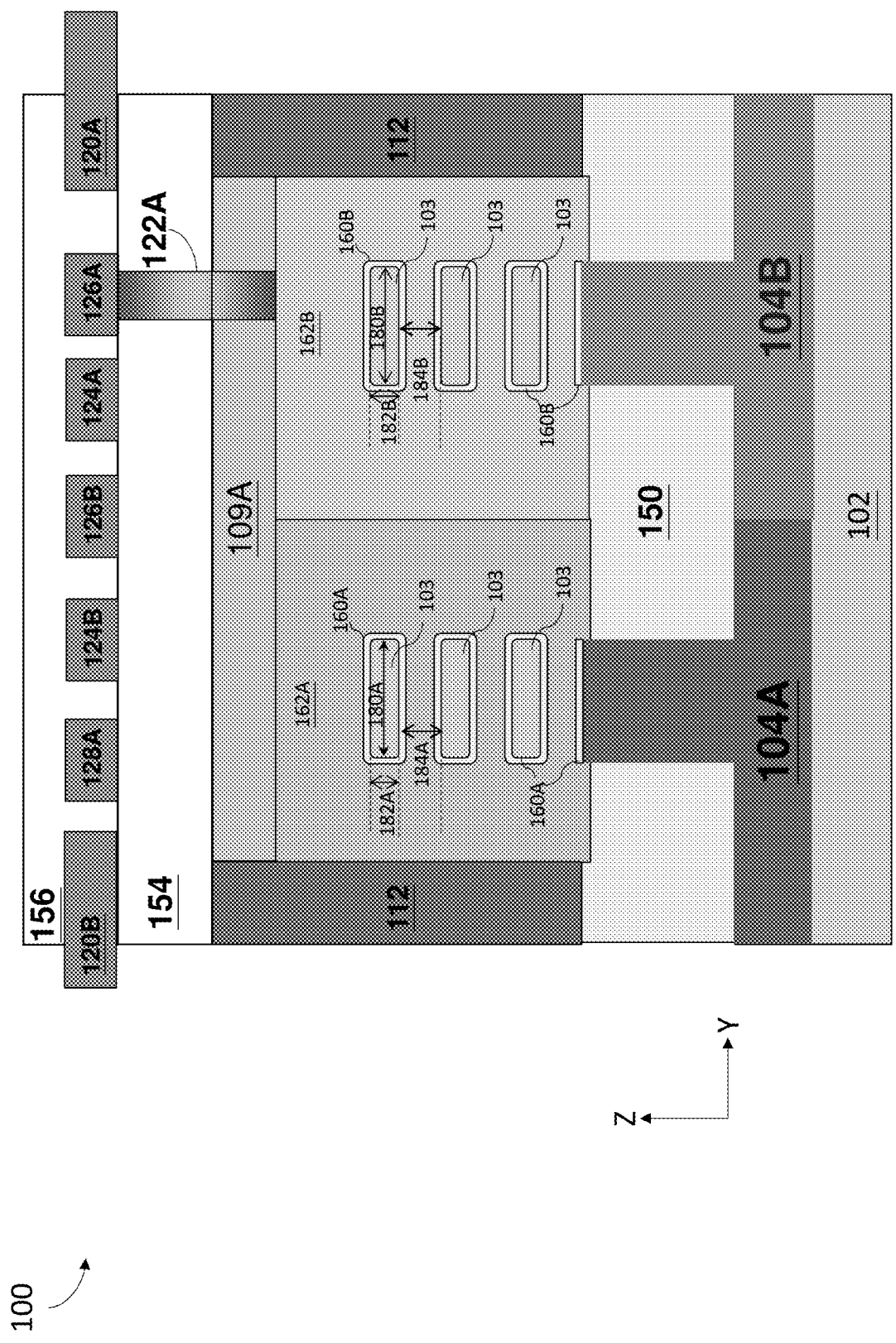
Figure 2D:
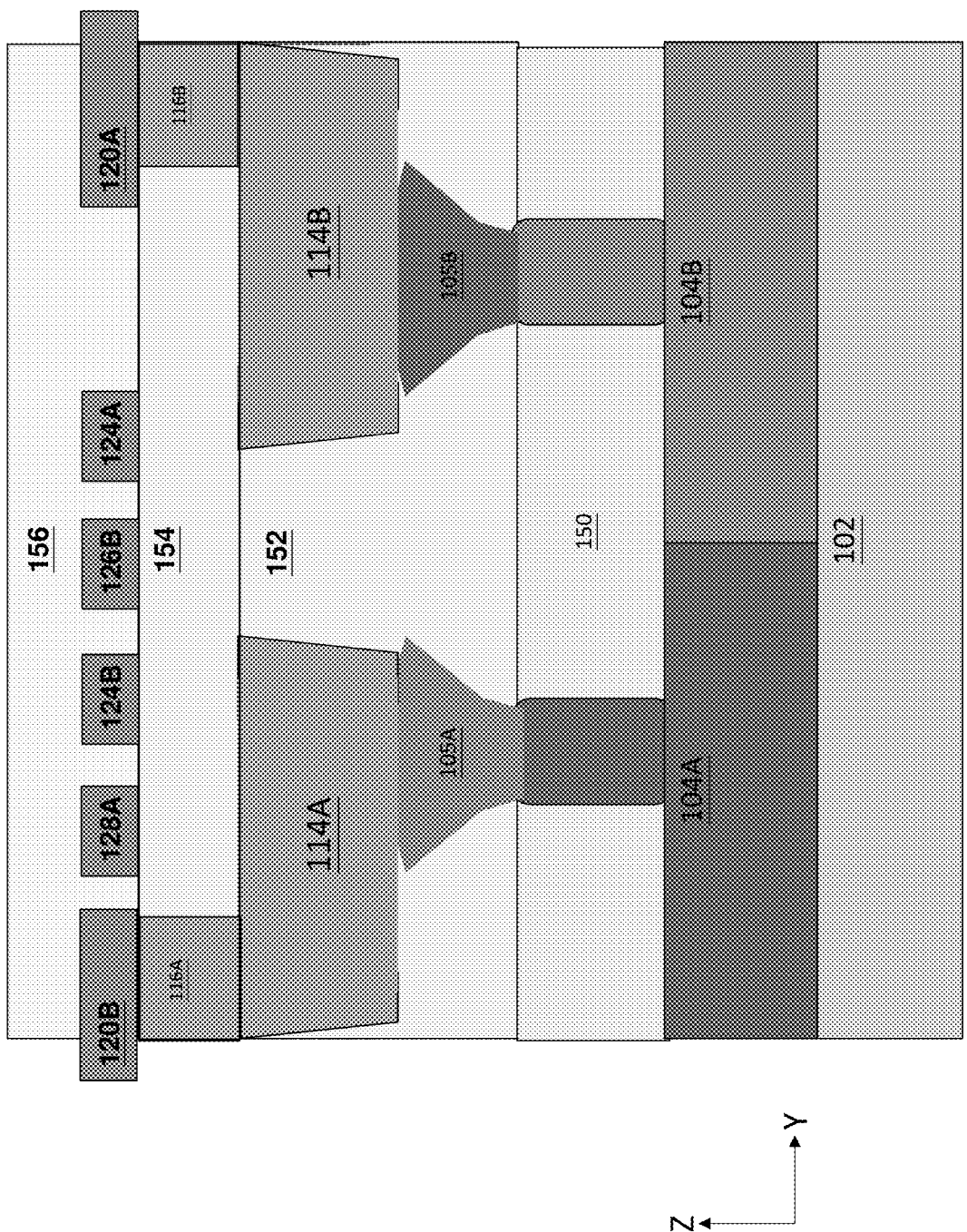
Figure 3A:
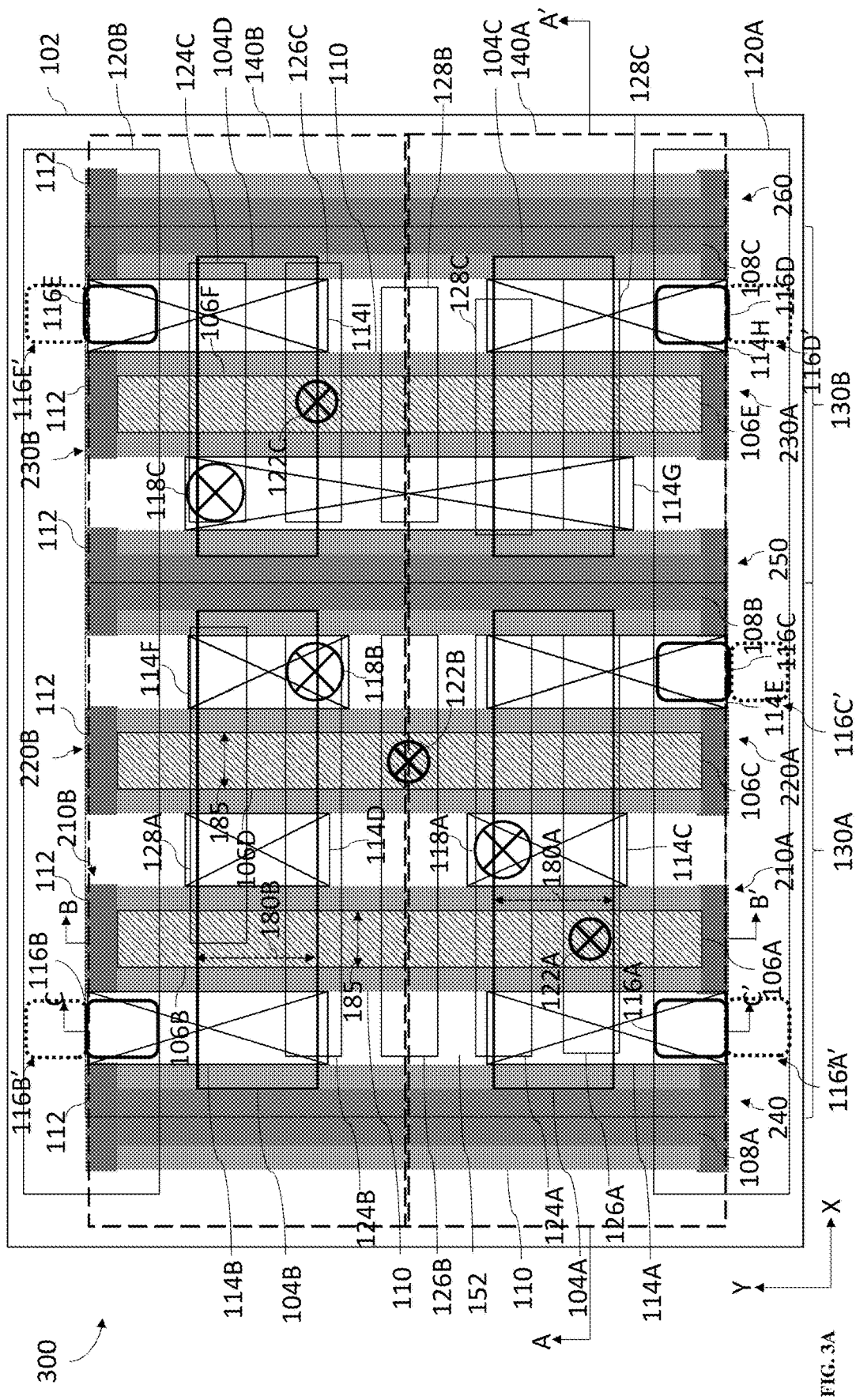
Figure 3B:
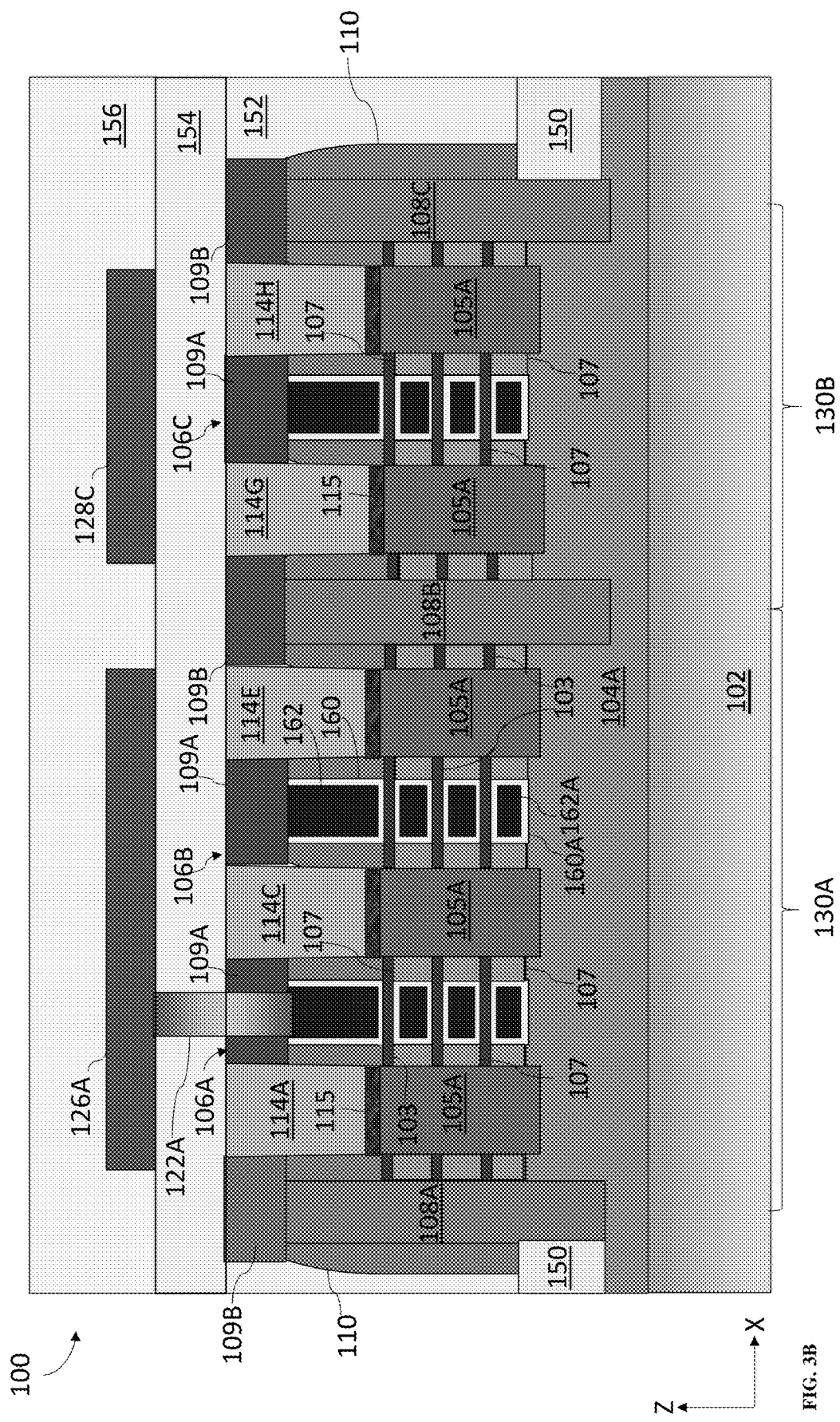
Figure 3C:
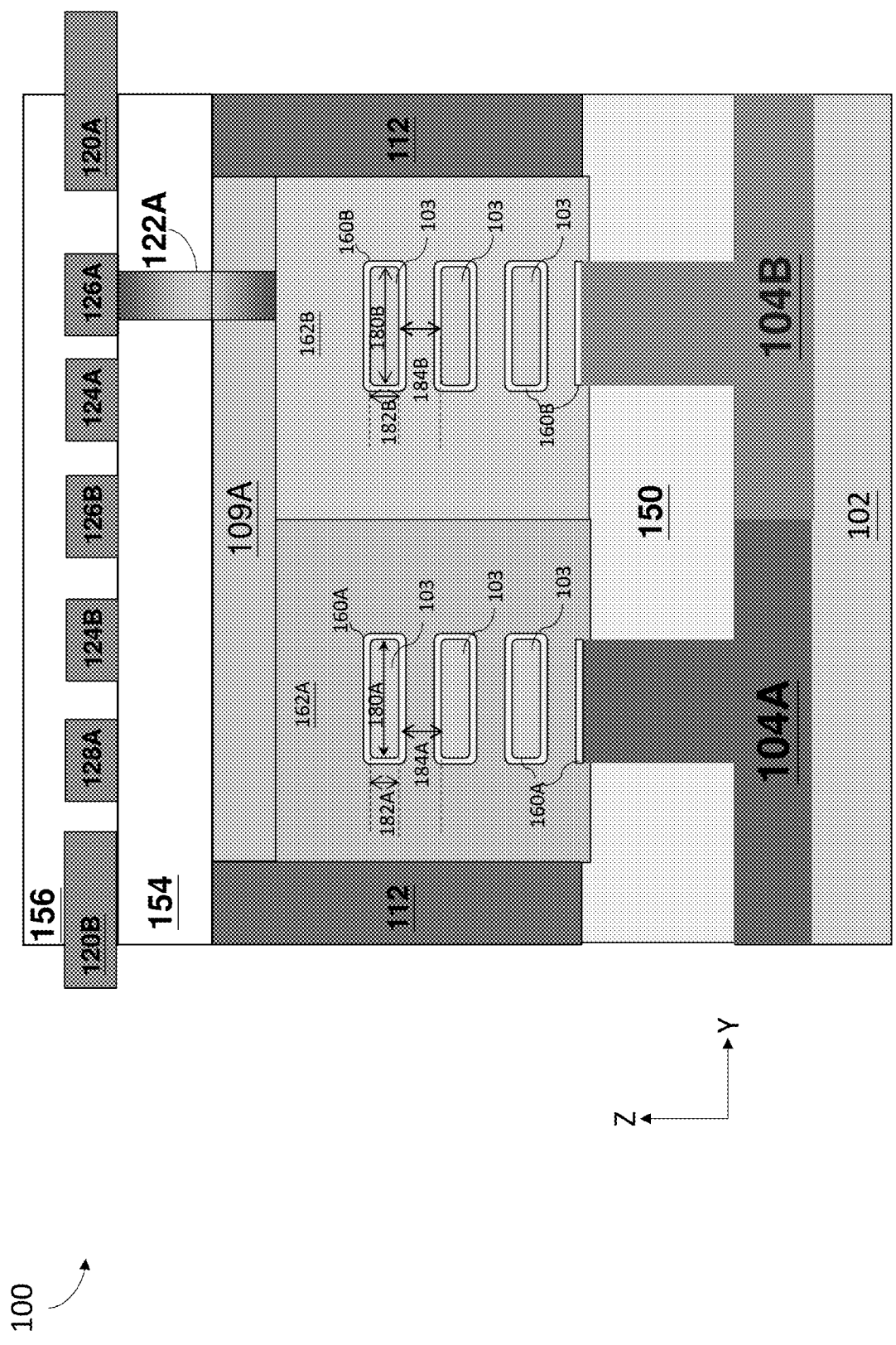
Figure 3D:
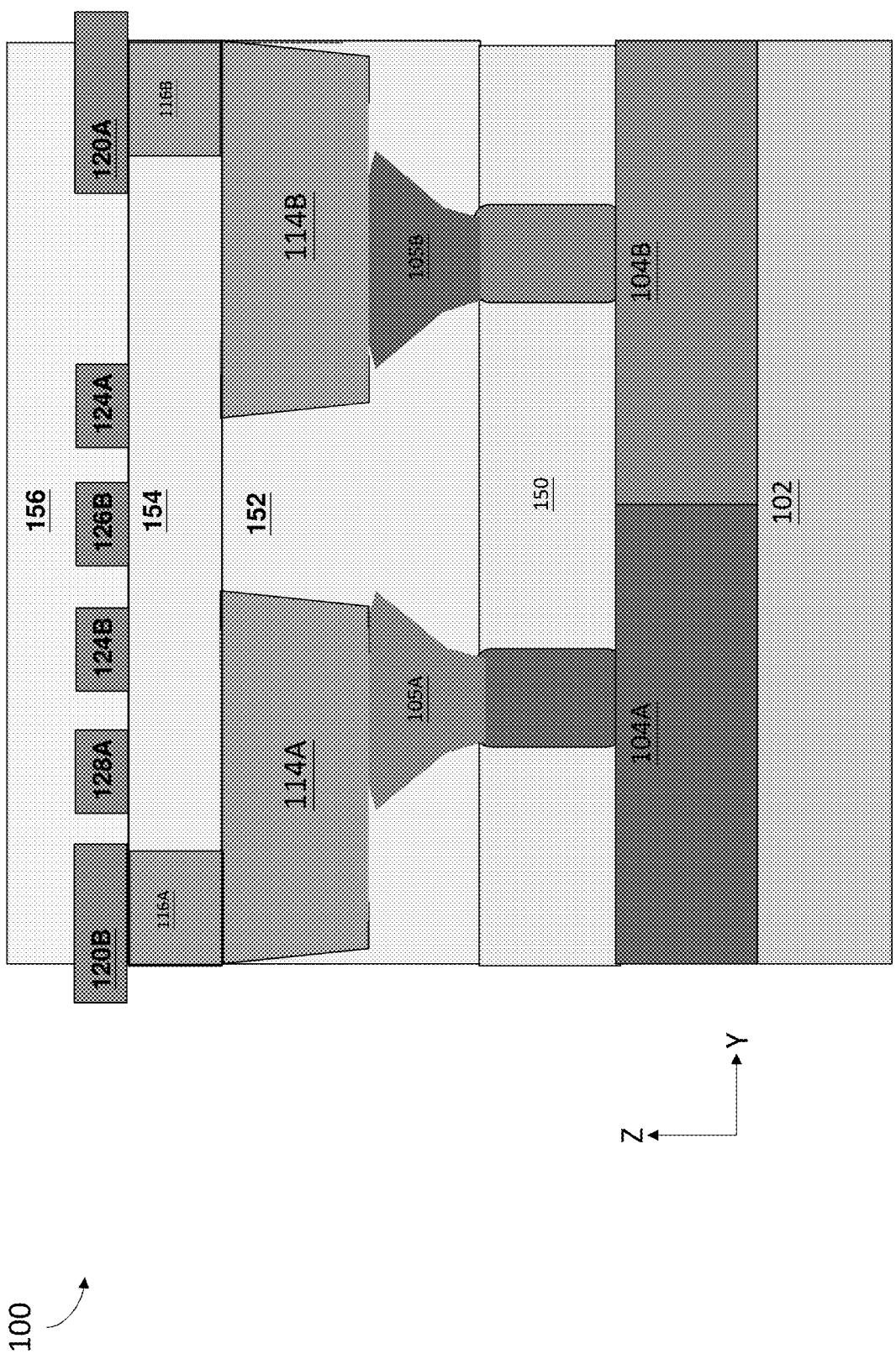

As described above, via features are formed to vertically connect conductive features of different metal layers. For example, source via 116 connects source contact 114s to metal line 120; drain via 118 connects drain contact 114d to metal line 124; and gate via 122 connects the gate stack 106 to metal line 126. Referring to FIG. 1G, the source via 116 has a width dimension 186 along the x-direction and a length dimension 188 along the y-direction. In some embodiments, the width dimension 186 may be similar to length dimension 188. For example, a ratio of the width dimension 186 to the length dimension 188 is about 1:1.2 to about 1.2:1. Accordingly, the source via 116 may have a shape that resembles a circle, an oval, a square, or a square with rounded corners. For example, having such symmetric profiles may be most cost effective. In the depicted embodiments, the source via 116 has a shape that resembles a square with rounded corners. As described later, in some embodiments, source vias 116 may be located on a cell boundary, such that the source via 116 may abut another source via 116 of an adjacent cell, thereby forming a combined source via 116'. In other words, the combined source via 116' is shared between the device 100 and an adjacent device. Accordingly, the combined source via 116' has the width dimension 186 along the x-direction and a length dimension 189 along the y-direction that equals twice the dimension 188. In some embodiments, a ratio of the length dimension 189 to the width dimension 186 may be greater than 2:1. Therefore, the combined source via 116' may have a profile that resembles a rectangle, a rectangle with rounded corners, an elliptical, or a thick line. Drain via 118 has a width dimension 190 along the x-direction, and a length dimension 192. In some embodiments, a ratio of the length dimension 192 to the width dimension 190 may be about 1.2:1 to about 1:1.2. Moreover, the gate via 122 has a width dimension 194 along the x-direction and a length dimension 196 along the y-direction. In some embodiments, a ratio of the length dimension 196 to the width dimension 194 may be about 1.2:1 to about 1:1.2. In the depicted embodiments, the drain via 118 and/or the gate via 122 are not on a boundary of a cell and do not abut another drain via or another gate via 122. Accordingly, the drain via 118 and the gate via 122 may each have a square, a square with rounded corner, a circle, or an elliptical shape.

As described above, the source via 116 (or combined source via 116') is connected to the metal line 120, and the drain via 118 is connected to the metal line 124. The via features may include any suitable electrically conductive material, such as Ta, Ti, Al, Cu, Co, W, Ru, TiN, TaN, other suitable conductive materials, or combinations thereof. In some embodiments, the source vias 116, the drain vias 118, and/or the gate vias 122 each include pure W, pure Ru, or combinations thereof; and barrier layers, adhesion layers, liner layers, or bulk layers are not formed on the via features. Accordingly, the source vias 116, the drain vias 118, and/or the gate vias 122 directly interface with the ILD layers surrounding them. As a result, the volume of the via features are maximized, and resistances therein are minimized. In some embodiments, the dimension of the source via 116 (or combined source via 116') and the dimension of the drain via 118 along the y-direction match that of the respective metal line overlaying thereon. For example, the length dimension 188 of the source via 116 (or the dimension 189 of the source via 116' when on the cell boundary) matches the width dimension of the metal line 120 along the y-direction; and the length dimension 192 of the drain via 118 matches the width dimension of the metal line 124. This configuration provides minimized resistances without unnecessarily increasing chip footprints. For example, the contact resistances are minimized when the surface area of the interface between the metal line and the via feature is maximized. This is achieved when the respective dimensions along the y-direction is matched. Via features having dimensions less than the those of the respective metal lines suffer increased resistance; while via features having dimensions greater than those of the respective metal lines cause unnecessary increase in chip footprint without benefit of effective resistance reduction.

Therefore, as the width dimension of metal line 120 is greater than the width dimension of the metal line 124, the source via 116 may have a greater length dimension than the drain via 118. In some embodiments, a ratio of the width dimension of metal line 120 to the width dimension of the metal line 124 is about 1.3:1 to about 10:1. If the ratio is too small, such as less than 1.3:1, the metal line 120 may have a high resistance insufficient to allow for sufficient operational current; if the ratio is too large, such as greater than 10:1, the metal line 124 may instead be too thin such that the metal line 124 becomes the bottleneck to the operational current, and also limits the overall device performance. A ratio of the dimension 188 to the length dimension 192 may be about 1.15:1 to about 5:1. Where the source via 116 is on the cell boundary, a ratio of the dimension 189 to the length dimension 192 may be about 1.3:1 to about 10:1. In other words, a ratio of the length dimension of the source via (or the combined source via) along the y-direction to the length dimension of the drain via along the y-direction may be about 1.15:1 to about 10:1. If the ratio of the dimension 189 to the length dimension 192 is too small, such as less than 1.3:1, or if the ratio is too large, such as greater than 10:1, the dimensions of the vias no longer matches the corresponding metal lines. Accordingly, either the resistances may not be optimized, or the features may occupy unnecessarily large chip footprints. In some embodiments, the width dimension of the source via along the x-direction is similar to the width dimension of the drain via 118. Accordingly, a ratio of the size (for example, a surface area of the cross-section along the x-y plane) of the source via 116 (or the combined source via 116') to the size of the drain via 118 may be about 1.15:1 to about 10:1.

In some embodiments, the drain via 118 has an area that is greater than the gate via 122. For example, the ratio of the size of the drain via 118 to the size of the gate via 122 may be about 1.1:1 to about 3:1. If the ratio is too small, such as less than 1.1:1, the gate via 122 may be too large to entirely fit onto the gate stack or the drain via 118 may be too small to have the optimized resistance; conversely, if the ratio is too large, such as greater than 3:1, the gate via 122 may be too small such that the high resistances therein may become the bottleneck for the operation. In some embodiments, the drain via 118 and the gate via have similar profiles. Accordingly, a dimension of the drain via 118 to a dimension of the gate via 122 may be about 1.7:1 to about 1.05:1. Moreover, the width dimension 194 of the gate via is less than the width of the gate stack 106. The smaller size of the gate via 122 is beneficial to improving device routing efficiency and ultimately to improving the device performances. For example, as described above, the gate stack 106 is between two gate spacers 110 which directly interface with the source contact 114s and with the drain contact 114d in the active region, respectively. Moreover, the source contact 114s and the drain contact 114d each extend above a top surface of the gate stack 106. Therefore, a gate via 122 that lands on (and directly contacting) the gate stack 106 in the active region has at least its lower portion sandwiched between the source contact 114s and the drain contact 114d along the y-direction. In some approaches that do not implement the embodiments disclosed herein, the gate via 122 has a larger dimension 194 than the dimension 185 of the gate stack 106. In other words, the gate via 122 forms partially on the top surface of the gate spacers 110, and is very close (such as within 2 nm) to the source contact 114s or the drain contact 114d. Any inadvertent misalignment may cause shorting between the source or drain contact with the gate via 122. While designing the gate via 122 to be located off the active region 104 does mitigate such shorting risks (such as designing the gate via 122 on the portion of the gate stack 106 sandwiched between isolation features 150, such that the gate via 122 and the source/drain contacts 114s and 114d are offset along the y-direction), excluding the placement of the gate via 122 from the active region may cause adverse effects. For example, as described above, the gate via 122 is connected to a specific metal line (such as metal line 126). Accordingly, the location of the gate via 122 mandates the metal line 126 to be routed through the top surface of the gate via 122. Because metal lines in the same metal layer generally extend in a parallel direction to avoid crossing and shorting each other, other metal lines are further restricted indirectly by the location of the gate via 122. Such restrictions block out subsets of design options, such as with regards to the placements of metal lines used for input and/or output purposes. In an aggressively scaled-down integrated circuit chip, such limits to design options sometimes mean reduced metal line packing density and/or reduced routing efficiency which leads to additional processing costs. According to the present disclosure, by contrast, the dimension 194 is less than the dimension 185. Therefore, the entirety of the gate via 122 may be placed on top surface of the gate stack without intruding onto the gate spacers. In other words, even if placed on the active region and directly between the source contact 114s and drain contact 114d, there is still decent margin (such as that corresponds to the dimension 183 of the gate spacers 110) to avoid shorting. Such improved processing margin enables those otherwise excluded designs to be properly adopted as necessary. In some embodiments, a ratio of the dimension 194 to the dimension 185 may be about 0.5 to about 0.95. If the ratio is too small, such as smaller than 0.5, the resistances within the gate via may become too high; while if the ratio is too large, such as larger than 0.95, there may not be sufficient processing margin to ensure the gate via lands entirely on the gate stacks without intruding onto the gate spacers and cause shorting concerns.

As described above, by implementing the described structure and method, the location of the gate via 122 is no longer restricted. In the depicted embodiments of FIGS. 1A-1C, the gate via 122 is formed on the gate stack 106 directly over the active region 104. For example, a projection of the gate via 122 along the z-direction lands on (or overlaps in its entirety with) the active region 104. In other words, a projection of the gate via 122 and a projection of the active region 104 along the z-direction overlaps on an x-y plane. In some embodiments, referring to FIG. 1E, the gate via 122 may alternatively be configured to be partially over the active region 104 and partially over the isolation feature 150. For example, a projection of the gate via 122 along the z-direction partially lands on the active region 104 and partially lands on the isolation feature 150. In other words, a projection of the gate via 122 along the z-direction overlaps with a boundary of the active region 104. In some embodiments, referring to FIG. 1F, the gate via 122 may alternatively be configured to be entirely off the active region 104 and entirely on the isolation feature 150. For example, a projection of the gate via 122 along the z-direction lands entirely off the active region 104. In other words, a projection of the gate via 122 along the z-direction and a projection of the active region 104 do not overlap with each other. Accordingly, the restriction described above with respect to the placement of the gate via 122 is eliminated. More design options are therefore available, which allows for optimization of metal line routing efficiency.

FIGS. 2A-2D illustrate a device 200 that implement the structure of the present disclosure, such as those described above with respect to FIGS. 1A-1G. In the depicted embodiments, the device 200 includes a plurality of CMOS devices and form two memory cells, such as an NAND cell 130A and an inverter cell 130B. The memory cells are separated along the x-direction from each adjacent cells using an isolation MOSFET. The details of the isolation MOSFET have been described in detail in U.S. Pat. No. 9,613,953, titled "Semiconductor device, semiconductor device layout, and method of manufacturing semiconductor device" to Jhon Jhy Liaw; U.S. Pat. No. 9,805,985, titled "Method of manufacturing semiconductor device and semiconductor device" to Jhon Jhy Liaw; and U.S. Pat. No. 9,793,273 titled "Fin-based semiconductor device including a metal gate diffusion break structure with a conformal dielectric layer" to Jhon Jhy Liaw, each of which are herein incorporated by reference in their entirety. Additionally, U.S. Pat. No. 8,952, 547, titled "Semiconductor device with contact structure with first/second contacts formed in first/second dielectric layers and method of forming same" to Jhon Jhy Liaw and U.S. Pat. No. 9,564,433, titled "Semiconductor device with improved contact structure and method of forming same" to Jhon Jhy Liaw, provide further details on via and contact schemes and are also herein incorporated by reference in their entirety.

As illustrated in FIGS. 2A-2D, the device 200 includes a plurality of device regions that each resembles the device 100 described above with respect to FIGS. 1A to 1G. For example, the device 200 includes a substrate region 140A and a substrate region 140B. In the depicted embodiments, the substrate regions 140A and 140B abut each other along the y-direction. The substrate regions 140A and 140B may each resemble the substrate region 140 (or doped region 140) of the device 100. As described above, the substrate regions 140A and 140B may be doped. In some embodiments, the substrate region 140A and the substrate region 140B have opposite types of dopants. For example, in the depicted embodiments, the substrate region 140A includes a p-type dopant, and is configured for an n-type transistor; while the substrate region 140B includes an n-type dopant, and is configured for a p-type transistor. The substrate region 140A includes a portion of the NAND cell 130A and a portion of the inverter cell 130B. The substrate region 140B includes another portion of the NAND cell 130A and another portion of the inverter cell 130B.

In some embodiments, the NAND cell 130A includes a CMOS having an NMOS portion on the substrate portion 140A and a PMOS portion on the substrate portion 140B. The NMOS portion on the substrate portion 140A includes an active region 104A that generally resembles the active region 104 described above with respect to FIGS. 1A to 1D. For example, the active region 104A extends lengthwise along the x-direction. The active region 104A may include a stack of semiconductor layers (such as channel layers) 103 formed on the base fins 103'. In the depicted embodiments, the stack of semiconductor layers 103 may each have a same lateral width 180A, the same thickness 182A, and be separated vertically from each other by the separation 184A. The lateral width 180A, the thickness 182A, and the separation 184A may each be the similar to the lateral width 180, the thickness 182, and the separation 184 described above with respect to FIG. 1C. In other embodiments, however, the lateral widths 180A, the thickness 182A of the semiconductor layers 103, and the separation 184A between vertically adjacent semiconductor layers 103 may be the same as or different from each other and may be the same as or different from the lateral width 180, the thickness 182, and the separation 184, respectively. In the depicted embodiments, the active region 104A extends continuously across the NAND cell 130A and the adjacent inverter cell 130B. A gate portion 210A is formed on the active region 104A, extending along the y-direction. The gate portion 210A includes a gate stack portion 106A (including a gate dielectric 160A and a gate electrode 162A), that generally resembles the gate stack 106 described above with respect to FIGS. 1A-1D. For example, the gate stack portion 106A may have a dimension 185 along the x-direction. In the depicted embodiments, the gate stack portion 106A is configured for an NMOS transistor. Accordingly, the gate stack portion 106A may include an n-type work function metal layer. The gate portion 210A includes gate spacers 110 and the gate end dielectric 112. The gate portion 210A defines the channel region of the active region 104A, as well as the source/drain regions on both sides of the channel region. Source/drain features 105A are formed in the source/drain regions, and the stack of semiconductor layers 103 described above are formed in the channel region of the active region 104A, such that the semiconductor layers 103 each connect a pair of source/drain features 105A. Source/drain contacts 114A, 114C are formed on the source/drain features 105A. Source/drain contact 114A generally resembles the source contact 114s as described above with respect to FIGS. 1A-1D; and the source/drain contact 114C generally resembles the drain contact 114d as described above with respect to FIGS. 1A-1D.

As described above, CMOS further includes a PMOS portion formed on the substrate portion 140B. The PMOS portion of the CMOS is formed on an active region 104B. The active region 104B extends lengthwise along the x-direction and generally resembles the active region 104A and resembles the active region 104 described above with respect to FIGS. 1A-1D. For example, the active region 104B includes a stack of semiconductor layers 103 formed over the base fin 103'. In the depicted embodiments, the stack of semiconductor layers 103 may each have a same lateral width 180B, the same thickness 182B, and be separated vertically from each other by the separation 184B. In some embodiments, the lateral width 180B may be greater than the lateral width 180A. In some embodiments, the differentiated lateral widths of the active regions 104A and 104B enables balancing of the current levels in both PMOS and NMOS transistors, thereby improving device performances.

Moreover, the active region 104B extends continuously across the memory cells 130A and 130B. The gate portion 210B is formed on the active region 104B and extending along the y-direction. The gate portion 210A and the gate portion 210B may be two connected portions of a contiguous gate structure. For example, the gate portion 210B includes a gate stack portion 106B and a portion of the gate spacers 110. The gate stack portion 106B connects to and aligns with the gate stack portion 106A thereby forming a contiguous gate stack. The gate stack portion 106B (including a gate dielectric 160B and a gate electrode 162B) generally resembles the gate stack 106 described above with respect to FIGS. 1A-1D. For example, the gate stack portion 106B may have a dimension 185 along the x-direction. Moreover, in the depicted embodiments, the gate portion 210B is configured for a PMOS. Accordingly, the gate stack portion 106B further includes a p-type work function metal layer. Additionally, the gate portion 210B also includes a gate end dielectric 112 on an end of the gate stack portion 106B (such as the end opposite to the gate end dielectric 112 of the gate portion 210A). The gate portion 210B defines the channel region of the active region 104B, as well as the source/drain regions on both sides of the channel region. Source/drain features 105B are formed in the source/drain regions, such that the stack of semiconductor layers 103 each connect a pair of source/drain features 105B. Source/drain contacts 114B, 114D are formed on the source/drain features 105B. Source/drain contact 114B generally resembles the source contact 114s as described above with respect to FIGS. 1A-1D; and the source/drain contact 114D generally resembles the drain contact 114d as described above with respect to FIGS. 1A-1D.

Additionally, the NAND cell 130A includes another gate structure having a gate portion 220A on the substrate portion 140A and a gate portion 220B on the substrate portion 140B. The gate portions 220A and 220B are each formed on a respective active region 104A and 104B (such as on a respective stack of semiconductor layers 103). The gate portions 220A and 220B include a gate stack 106C and a gate stack 106D, respectively. The gate stack portion 106C generally resembles the gate stack portion 106A described above with respect to FIGS. 2A-2D; and the gate stack portion 106D generally resembles the gate stack portion 106B described above with respect to FIGS. 2A-2D. In the depicted embodiments, both gate stack portions 106C and 106D may have a dimension 185 along the x-direction. The gate portions 220A and 220B further each include, gate spacers 110, gate end dielectric 112, and gate top hard mask layer 109A. Source/drain features 105A are formed in the source/drain regions of the active region 104A, such that the stack of semiconductor layers 103 on the active region 104A each connects a pair of source/drain features 105A. Source/drain features 105B are formed in the source/drain regions of the active region 104B, such that the stack of semiconductor layers 103 on the active region 104B each connect a pair of source/drain features 105B. In the depicted embodiments, one of the source/drain features 105A (such as the one formed between gate portion 210A and gate portion 220A) serves as the drain feature in operation and is therefore referred to herein as the "common drain 105A". This common drain 105A is shared by two adjacent NMOS transistors formed on the gate portion 210A and gate portion 220A. Similarly, one of the source/drain features 105B (such as the one formed between gate portion 210B and gate portion 220B) also serves as the drain feature in operation, and is therefore referred to herein as "common drain 105B". This common drain 105B is shared by two adjacent PMOS transistors formed on the gate portion 210B and gate portion 220B. Source/drain contacts 114C, 114E are formed on the source/drain features 105A, where the source/drain contact 114C is formed on the common drain 105A and shared by the two adjacent NMOS transistors; and source/drain contacts 114D, 114F are formed on the source/drain features 105B, where the source/drain contact 114D is formed on the common drain 105B and shared by the two adjacent PMOS transistors.

Source vias 116A, 116B, 116C are formed on the source/drain contacts 114A, 114B, 114E, respectively; drain vias 118A, 118B are formed on the source/drain contact 114C, 114F, respectively. Moreover, gate vias 122A and 122B are formed on the gate stack 106A and 106C/106D, respectively. The source vias 116A, 116B, 116C each generally resemble the source via 116 described above with respect to FIGS. 1A-1G. For example, as described above with respect to FIGS. 1G, one or more of the source vias 116A, 116B, 116C may abut a source via of an adjacent memory cell, and thereby forming a combined source via 116A', 116B', and/or 116C'. The combined source vias 116A', 116B', and/or 116C' may have a profile that resembles a rectangle, a rectangle with rounded corners, or a thick line. Furthermore, the combined source vias may have a dimension 189 (see FIG. 1G) that matches the dimension of metal line overlaying thereon (such as the metal lines 120A and 120B). The drain vias 118A, 118B generally resembles the drain via 118 described above with respect to FIGS. 1A-1G. For example, the drain vias 118A, 118B may have a profile that resembles a square, a square with rounded corners, a circle, or an elliptical. Moreover, the dimension of the drain vias 118A, 118B match the dimension of the metal line overlaying thereon (such as the metal lines 124A and 124B).

The gate vias 122A and 122B generally resemble the gate via 122 described above with respect to FIGS. 1A-1D and 1G. For example, the gate vias 122A and 122B may each have a length dimension 196 along the y-direction and a width dimension 194 along the x-direction. A ratio of the length dimension 196 to the width dimension 194 may be about 1.2:1 to about 1:1.2. In some embodiments, the gate vias 122A and 122B may have a circle shape or an elliptical shape. In some embodiments, the gate vias 122A and 122B each have the width dimension 194 and the length dimension 196. As described above, the width dimension 194 may be less than the width dimension 185 of the gate stacks 106A, 106B, 106C, and 106D. Accordingly, in some embodiments, the entirety of the gate vias 122A and 122B are formed on the respective gate stacks. Although FIGS. 2A-2D depict the gate vias 122A as formed in its entirety on the gate portion 106A, the gate vias 122A may alternatively be formed in its entirety on the gate stack portion 106B, or may be formed partially on the gate stack portion 106A and partially on the gate stack portion 106B. Similarly, although FIGS. 2A-2D depict the gate via 122B as formed partially on the gate stack portion 106C and gate stack portion 106D, the gate via 122B may alternatively be formed entirely on the gate stack portion 106C or entirely on the gate stack portion 106D.

Moreover, as described above with respect to FIGS. 1A-1G, the gate vias 122A and 122B may each be independently placed anywhere on the respective gate stack portions 106A, 106B, or gate stack portions 106C, 106D. For example, in the depicted embodiments, the gate via 122A is placed, in its entirety, on a portion of a gate stack portion 106A over the active region 104A. In other words, a projection of the gate via 122A along the z-direction towards the substrate lands entirely within an active region 104A. The gate via 122B is placed, in its entirety, on a portion of a gate stack over the isolation features 150 such that the gate via 122B is offset from the active regions 104A and 104B along the y-direction (and also offset from the source/drain features and source/drain contacts). In other words, a projection of the gate via 122B along the z-direction towards the substrate falls entirely outside the active regions (such as the active regions 104A and 104B). Alternatively, the gate via 122A may be placed in its entirety on a portion of a gate stack over the isolation features 150. In other words, a projection of the gate via 122A along the z-direction towards the substrate lands entirely outside the active regions. Still alternatively, the gate via 122A may be placed partially on a portion of a gate stack over an active region (such as active region 104A or 104B) and partially on another portion of gate stack over the isolation feature 150 between the active regions 104A and 104B. In other words, a projection of the gate via 122A along the z-direction towards the substrate lands on a boundary of an active region. Similarly, alternative to a gate stack portion over the isolation feature 150, the gate via 122B may be placed in its entirety on a portion of a gate stack over an active region (such as active region 104A or 104B); or may be placed partially on a portion of gate stack over an active region and partially on another portion of gate stack over the isolation feature between the active regions 104A and 104B. The ability to freely choose the location of the gate vias 122A and 122B during the design phase without concern for shorting with source/drain contacts or source/drain vias provides the designer the opportunity to maximize the routing efficiency of metal lines over the device 200 while preserving the device integrity. As a result, the overall device performance may be improved.

Furthermore, the source via 116A is connected to a metal line 120A (such as a $V_{DD}$ line), the source via 116B is connected to a metal line 120B (such as a $V_{SS}$ line), drain via 118A is connected to a metal line 124A, drain via 118B is connected to a metal line 124B, gate via 122A is connected to a metal line 126A (such as a word line), and gate via 122B is connected to a metal line 126B (such as a word line). The metal lines 120A and 120B each resemble the metal lines 120 described above with respect to FIGS. 1A-1D; the metal lines 124A, 124B each resemble the metal lines 124 described above with respect to FIGS. 1A-1D; and the metal line 126A resembles the metal line 126 described above with respect to FIGS. 1A-1D. A metal line 128A, a metal line 128B, and a metal line 128C are disposed in ILD 156 and may be connected to vias, source/drain contacts, gates, source/drains, etc. of NAND cell 130A and/or inverter cell 130B.

In some embodiments, the device 200 includes an inverter cell 130B. The inverter cell 130B may include a gate structure spanning across the active region 104A and the active region 104B. For example, the gate structure includes a gate portion 230A formed on the active region 104A in the substrate region 140A and a gate portion 230B formed on the active region 104B in the substrate region 140B. The gate portions 230A and 230B each define a channel region of the respective active regions 104A and 104B, and source/drain regions on both sides of the respective channel region. The gate structure includes a gate stack portion 106E on the substrate portion 140A and a gate stack portion 106F on the substrate portion 140B. The gate stack portions 106E and 106F each may be similar to the gate stack 106 described above with respect to FIGS. 1A-1G. For example, the gate stacks 106E, 106F may each have a width dimension 185 along the x-direction. The gate stack 106E may include an n-type work function layer; and the gate stack 106F may include a p-type work function layer. Suspended channel layers 103 are formed in the channel regions. Source/drain features 105A are formed in the source/drain regions of the active region 104A; source/drain features 105B are formed in the source/drain regions of the active region 104B. Source contact 114H is formed on source/drain feature 105A and source contact 114I is formed on the source/drain feature 105B. In the depicted embodiments, the drain contact 114G is formed on and span across the source/drain features 105A and 105B. In other words, the drain contact 114G is a common drain contact between an NMOS transistor on the substrate region 140A and a PMOS transistor on the substrate region 140B. Source vias 116D and 116E are formed on source contacts 114H and 114I, respectively. Drain via 118C is formed on the drain contact 114G. In some embodiments, the source via 116D and 116E each resemble the source via 116 described above with respect to FIGS. 1A-1G; and the drain via 118C resembles the drain via 118 described above with respect to FIGS. 1A-1G. For example, the source via 116D and 116E are formed on a cell boundary and each abut another source via of an adjacent memory cell, thereby forming the combined source vias 116D' and 116E', respectively. In the depicted embodiment, the gate via 122C is formed on gate stack 106F. The gate via 122C may be similar to the gate via 122 described above with respect to FIGS. 1A-1G. For example, the gate via 122C may have a length dimension 196 along the y-direction and a width dimension 194 along the x-direction. The length dimension 196 may be similar to the width dimension 194. For example, a ratio of the length dimension 196 to the width dimension 194 may be about 1:1.2 to about 1.2:1. In some embodiments, the width dimension 194 is less than the dimension 185 of the gate stack 106F. Accordingly, similar to the embodiments illustrated with respect to FIGS. 1A-1G, the gate via 122C may be placed anywhere on the gate stack portions 106E and 106F, such as entirely over the active region 104A, entirely over the active region 104B, entirely over the isolation feature 150, partially over the active region 104A, partially over the active region 104B, or partially over the isolation feature 150. In other words, there is no restriction as to the placement of the gate via 122C along the y-direction. As described above, such freedom provides more efficient metal line routing and improved packing density.

As described above, although the gate vias 122A, 122B, and 122C are illustrated to be in a certain location of the device 200, they each may be placed anywhere on their respective gate stacks, depending on design requirement (such as to improve metal line routing efficiency). Therefore, each of the gate vias 122A, 122B, and 122C may be over the same or different location as one another.

The NAND cell 130A and the inverter cell 130B each include isolation MOSFETs formed on the cell boundaries. For example, the NAND cell 130A may include isolation MOSFET gate portion 240A, 240B on one side of the NAND cell 130A, and isolation MOSFET gate portions 250A, 250B on an opposite side of the NAND cell 130A. Similarly, the inverter cell 130B may include isolation MOSFET gate portions 250A, 250B on one side of the inverter cell 130B; and isolation MOSFET gate portions 260A, 260B on an opposite of the inverter cell 130B. These isolation MOSFET gate portions are each connected to a voltage through a respective gate via feature 132A, 132B, 132C, 132D, 132E, and 132F. Isolation MOSFET gate portion 240A includes gate stack portion 108A, isolation MOSFET gate portion 250A includes gate stack portion 108B, and isolation MOSFET gate portion 260A includes gate stack portion 108C. The gate stack portions 108A-108C generally resemble the gate stacks described herein. For example, each of gate stack portions 108A-108C has a gate stack (e.g., a gate electrode and a gate dielectric), gate spacers 110, and a gate top hard mask layer 109B. The gate via features 132A, 132B, 132C, 132D, 132E, and 132F may be similar to the gate vias 122A, 122B, and 122C. The isolation MOSFET gate portions on the substrate portion 140A are separated from the isolation MOSFET gate portions on the substrate portion 140B by gate end dielectrics 113. The isolation MOSFET may be fabricated by any suitable methods.

FIG. 3A-3D illustrate a device 300 that implement the structure of the present disclosure. The device 300 generally resembles the device 200 described above with respect to FIGS. 2A-2D. For example, the device 300 includes a plurality of CMOS devices that form two memory cells, such as an NAND cell 130A and an inverter cell 130B. The NAND cell 130A and the inverter cell 130B each resembles those respective memory cells described above with respect to FIGS. 2A-2D. For example, the memory cells each include source vias 116A, 116B, 116C, 116D, and 116E formed on source contacts, drain vias 118A, 118B, 118C formed on the drain contacts, and gate vias 122A, 122B, 122C formed on gate stacks. Similar to device 200, one or more source vias may be formed on a boundary of the memory cell. In some embodiments, they abut another source via and form combined source vias (such as combined source via 116A', 116B', 116C', 116D', and 116E'). The combined source vias 116A', 116B', 116C', 116D', 116E' and the drain vias 118A, 118B, 118C each have a dimension along the y-direction that matches metal lines overlaying thereon (such as metal lines 120A, 120B for the combined source via 116A', 116B', and 116C', and metal line 124A, 124B, 124C for the drain vias 118A, 118B, 118C, respectively). The gate vias 122A, 122B, and 122C may each have the dimension 194 along the x-direction. Meanwhile, the device 300 further includes gate stack portions 106A, 106B, 106C, 106D, 106E, and 106F. The gate stacks may each have the dimension 185 along the x-direction. The dimension 194 may be less than the dimension 185.

Unlike device 200, where isolation MOSFET separates the adjacent memory cells, the memory cells of the device 300 are separated from each other and from other adjacent cells using dielectric gates. Moreover, the dielectric gates are configured to physically cut off the active regions, such that they do not continuously extend across the boundary of adjacent memory cells. For example, the active regions 104A, 104B of NAND cell 130A are separated by the dielectric gate 250 and not connected to the active regions 104C, 104D of the inverter cell 130B. Moreover, the active regions 104A, 104B of NAND cell 130A are further separated by the dielectric gate 240 on the opposite side from another adjacent memory cell; and the active regions 104C, 104D of inverter cell 130B are further separated by the dielectric gate 260 on the opposite side from another adjacent memory cell. The dielectric gates may be fabricated by any suitable methods.

Figure 4:
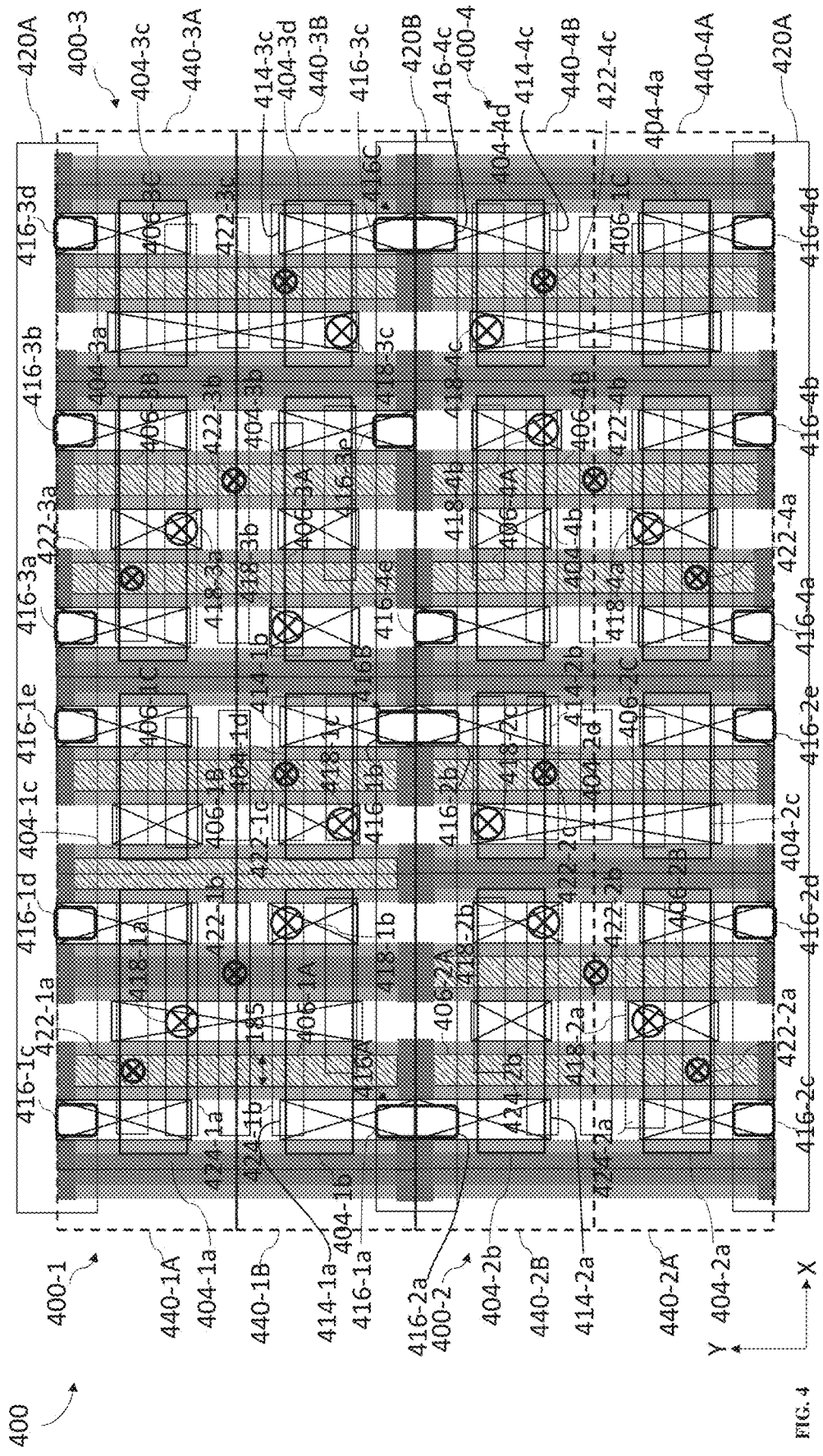

Referring to FIG. 4, the memory cells 130A, 130B described above with respect to FIGS. 2A-2D and/or FIGS. 3A-3D may be part of a device having a memory array, such as device 400. The device 400 includes memory cells 400-1, 400-2, 400-3, and 400-4. Each of these memory cells may independently resemble those memory cells 200 or 300 described above with respect to FIGS. 2A-2D or FIGS. 3A-3D. For example, FIG. 4 depicts device 400 having memory cells 400-1, 400-2, 400-3, and 400-4, each resembling memory cell 300 described above with respect to FIGS. 3A-3D. For example, the memory cells 400-1, 400-2, 400-3, and 400-4 may each include active regions 404-1a, 404-1b, 404-1c, 404-1d and substrate regions/portions 440-1A, 440-1B; active regions 404-2a, 404-2b, 404-2c, 404-2d and substrate regions/portions 440-2A, 440-2B; active regions 404-3a, 404-3b, 404-3c, 404-3d and substrate regions/portions 440-3A, 440-3B; and active regions 404-4a, 404-4b, 404-4c, 404-4d and substrate regions/portions 440-4A, 440-4B, respectively. The active regions are separated from each other along the x-direction by the dielectric gates; and along the y-direction by the isolation features 150. For example, the memory cells 400-1 may include source vias 416-1a, 416-1b, 416-1c, 416-1d, 416-1e; the memory cells 400-2 may include source vias 416-2a, 416-2b, 416-2c, 416-2d, 416-2e; the memory cells 400-3 may include source vias 416-3a, 416-3b, 416-3c, 416-3d, 416-3e; the memory cells 400-4 may include source vias 416-4a, 416-4b, 416-4c, 416-4d, 416-4e. These source vias are formed on respective source contacts and connect to respective metal lines. Similarly, the memory cells 400-1 may include drain vias 418-1a, 418-1b, 418-1c; the memory cells 400-2 may include drain vias 418-2a, 418-2b, 418-2c; the memory cells 400-3 may include drain vias 418-3a, 418-3b, 418-3c; the memory cells 400-4 may include drain vias 418-4a, 418-4b, 418-4c. These drain vias are formed on respective drain contacts and connect to respective metal lines. And the memory cells 400-1 may further include gate vias 422-1a, 422-1b, 422-1c; the memory cells 400-2 may include gate vias 422-2a, 422-2b, 422-2c; the memory cells 400-3 may include gate vias 422-3a, 422-3b, 422-3c; the memory cells 400-4 may include gate vias 422-4a, 422-4b, 422-4c. These gate vias are formed on respective gate stacks and connect to respective metal lines. In some embodiments, the source vias, drain vias, and gate vias may each resemble source via 116, drain via 118, and gate via 122, respectively, described above with respect to FIGS. 1A-1G. For example, the source vias may each have a length dimension 188 and a width dimension 186; the drain vias may each have a length dimension 192 and a width dimension 190; the gate vias may each have a length dimension 196 and a width dimension 194.

As described above, the source vias may have a size greater than that of the drain vias. In the depicted embodiments, the source vias 416-1a and 416-2a are formed on source contacts 414-1a and 414-2a, respectively. The source contacts 414-1a and 414-2a may be formed on a cell boundary, thereby abutting each other and forming a combined source contact (interchangeably referred to as a long source contact). Meanwhile, the source vias 416-1a and 416-2a also are formed on the cell boundary, thereby abutting each other and forming a combined source via 416A (interchangeably referred to as a long source via 416A). Similarly, the source vias 416-1b and 416-2b abut each other forming a combined source via 416B, and the source vias 416-3c and 416-4c abut each other forming a combined source via 416C. In some embodiments, referring back to FIG. 1G, the combined source via 416A, 416B, and 416C may have a length dimension 189 and a width dimension 186. A ratio of the length dimension 189 to the width dimension 186 may be greater than 2:1. The drain vias are not formed on the cell boundaries and may be generally similar to those drain vias 118 described above with respect to FIGS. 1A-1D. Accordingly, a ratio of the size of the source vias 416-1c, 416-1d, 416-1e, 416-2a, 416-2c, 416-2d, 416-2e, 416-3a, 416-3b, 416-3c, 416-3e, 416-4a, 416-4b, 416-4d, 416-4e to the size of drain vias 418-1a, 418-1b, 418-1c, 418-2a, 418-2b, 418-2c, 418-3a, 418-3b, 418-3c, 418-4*a*, 418-4*b*, 418-4*c* may be about 1.15:1 to about 5:1. Moreover, a ratio of the size of the combined source vias 416A, 416B, and 416C to the drain vias may be about 2.3:1 to about 10:1. As described above, the sizes of the source vias are designed to match a dimension of the overlaying metal line 420A, 420B thereon to minimize the contact resistances as well as the resistances in the source vias. The sizes of the drain vias are designed to match a dimension of the overlaying metal line to minimize the resistance in the drain vias without impeding with the downsizing of the features.

Additionally, the device 400 includes gate stacks 406-1A, 406-1B, 406-1C, 406-1D, 406-2A, 406-2B, 406-2C, 406-2D, 406-3A, 406-3B, 406-3C, 406-3D, 406-4A, 406-4B, 406-4C, and 406-4D, each of which may have a width dimension 185 along the x-direction. As described above, the gate vias 422-1*a*, 422-1*b*, 422-1*c*, 422-2*a*, 422-2*b*, 422-2*c*, 422-3*a*, 422-3*b*, 422-3*c*, 422-4*a*, 422-4*b*, and/or 422-4*c* may have a width dimension 194 along the x-direction. The width dimension 194 may be less than the dimension 185. For example, a ratio of the dimension 194 to the dimension 185 may be about 0.5 to about 0.95. If the ratio is too small, such as less than 0.5, the gate via may be too small and have a resistance that is too high. If the ratio is too large, such as greater than 0.95, in cases of misalignment, the gate via may intrude onto the gate spacers and cause a shorting concern with the adjacent contacts. As described above, this enables the placements of gate vias on any location of the gate stacks along the y-direction, without concern for inadvertent shorting between the gate vias and the source/drain contacts.

Alternatively, one or more of the memory cells 400-1, 400-2, 400-3, and 400-4 of device 400 may instead resemble memory cell 200 described above with respect to FIGS. 2A-2D. For example, isolation MOSFETs may be used to isolate the adjacent memory cells; and the active regions may each extend across the cell boundaries.

Figure 5A:
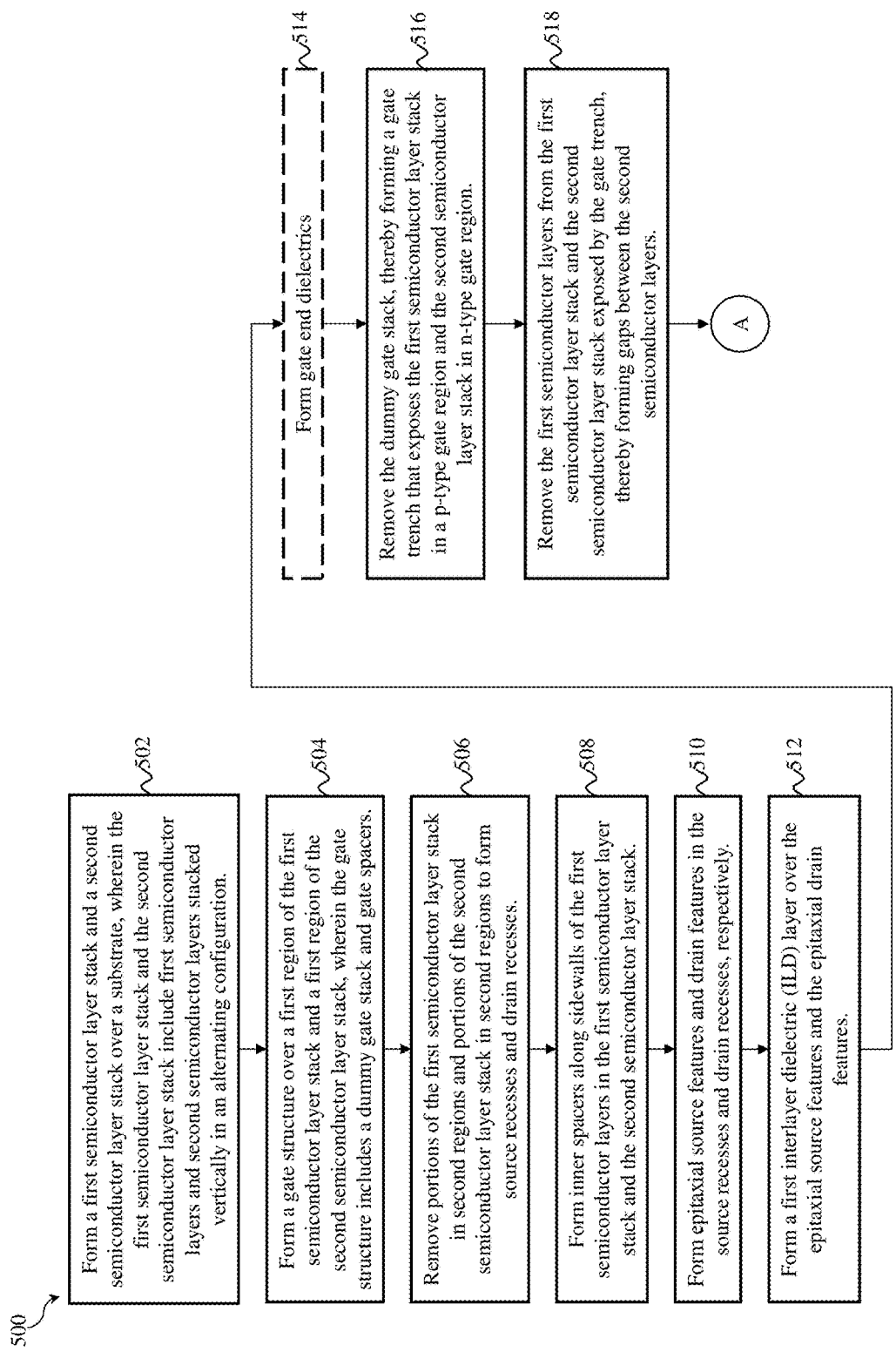
FIGS. 5A-5B are a flow chart of a method for fabricating nano-sheet based devices according to various aspects of the present disclosure.
Figure 5B:
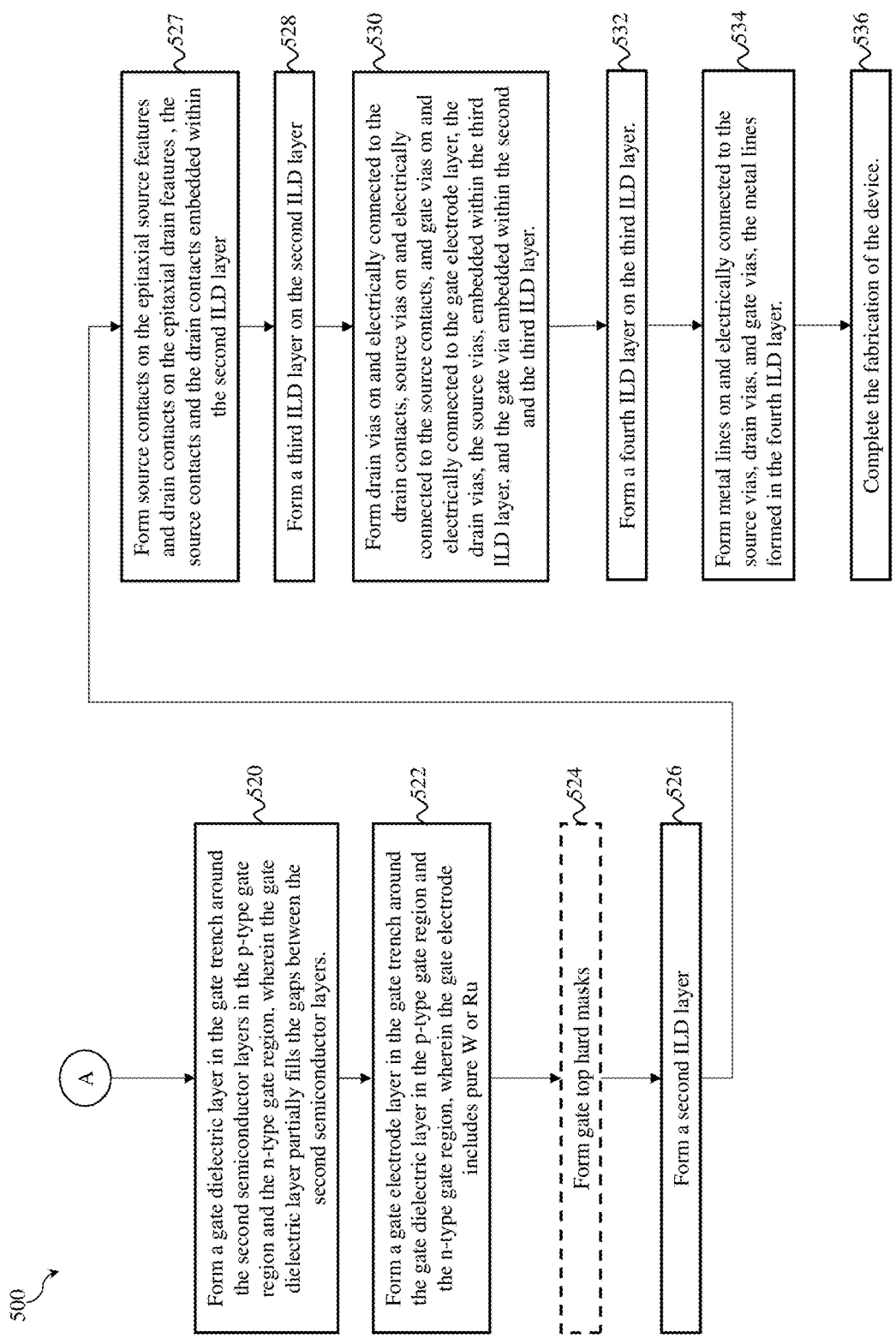

FIGS. 5A-5B are a flow chart of a method 500 for fabricating a multigate device (such as device 100, 200, 300, or 400) according to various aspects of the present disclosure. Referring to block 502, a semiconductor substrate is received and doped based on design needs. Active regions are formed on the semiconductor substrate. For example, a semiconductor layer stack is formed on the substrate. The semiconductor layer stack includes a first semiconductor layer and a second semiconductor layer stacked vertically in an alternating configuration. The first and the second semiconductor layers have different material compositions such that etching selectivity may be achieved in subsequent processing. The semiconductor layer stack is then patterned to form a plurality of stacks thereby forming a plurality of active regions extending lengthwise parallel to each other. Dielectric materials are formed between at least bottom portions of the active regions, thereby forming the isolation features.

Referring to block 504, gate structures are formed over and across the plurality of stacks (such as along a direction perpendicular to the lengthwise direction of the active regions). The gate structure includes a dummy gate stack (such as including polysilicon) and gate spacers on both sides of the dummy gate stack. Referring to block 506, portions of each of the stacks are removed (or recessed) to form source recesses and drain recesses on the active regions. Referring to block 508, portions of the first semiconductor layers of the stacks are laterally recessed to form gaps between vertically adjacent second semiconductor layers and between the second semiconductor layer and the substrate. Dielectric materials are formed in the gaps to form inner spacers (e.g., inner spacers 107) along sidewalls of the recessed first semiconductor layers and between vertically adjacent second semiconductor layers. Referring to block 510, epitaxial source features and drain features are formed in the source recesses and drain recesses, respectively, for example, using epitaxial growth methods. Accordingly, the epitaxial source features and drain features are formed on both ends of each of the second semiconductor layers of the plurality of stacks.

Referring to block 512, a first ILD layer is formed over the epitaxial source features and the epitaxial drain features. Referring to block 514, lithography methods may be used to define and form gate ends. For example, a photoresist is formed to cover the device while leaving a portion of the gate structure exposed. An etching operation is then conducted to remove the exposed portion of the gate structure. Subsequently, dielectric material is filled into the recess formed, thereby forming gate end dielectrics. The formed gate end dielectric defines individual gate suitable for an NMOS transistor, for a PMOS transistor, or for a CMOS transistor. In some embodiments, the gate end dielectric formation is omitted.

Referring to block 516, the dummy gate stacks are removed, thereby forming gate trenches that expose the plurality of semiconductor layer stacks (such as a semiconductor layer stack in a p-type gate region and a semiconductor layer stack in n-type gate region). Referring to block 518, the recessed first semiconductor layers are removed from the plurality of semiconductor layer stacks exposed by the gate trench, thereby forming gaps between the second semiconductor layers.

Referring to block 520, a gate dielectric layer is formed in the gate trench around the second semiconductor layers. The gate dielectric layer partially fills the gaps between the second semiconductor layers. Referring to block 522, a gate electrode layer is formed in the gate trench around the gate dielectric layer. In some embodiments, the gate electrode includes tungsten (W) (such as pure W) or ruthenium (Ru). The gate electrode fills the gate trench. In some embodiments, the gate electrode includes a work function metal layer. Referring to block 524, gate top hard masks are formed over the gate dielectric layers and the gate electrode layers. In some embodiments, however, the formation of the gate top hard mask layer is omitted.

Referring to block 526, a second ILD layer is formed over the device. Referring to block 527, source contacts are formed on the epitaxial source features and drain contacts are formed on the epitaxial drain features. The source contacts and the drain contacts are embedded within the second ILD layer. Referring to block 528, a third ILD layer is formed over the second ILD layer. Referring to block 530, drain vias are formed on the drain contacts and electrically connected to the drain contacts; source vias are formed on the source contacts, and electrically connected to the source contacts. Moreover, gate vias are formed on the gate electrode layer of the gate stack and electrically connected to the gate electrode. The drain vias, the source vias are embedded within the third ILD layer, and the gate via is embedded within the second and the third ILD layer. Referring to block 532, a fourth ILD layer is formed over the third ILD layer. Referring to block 534, metal lines are formed on the source vias, drain vias, and gate vias, and electrically connected to the source vias, drain vias, and gate vias, respectively. The metal lines are formed in the fourth ILD layer. Referring to block 536, additional processing may be conducted to complete the fabrication of the device. For example, additional via features and/or metal layers may be formed thereon. Additional packaging components may be formed. Additional processing is contemplated by the present disclosure. Additional steps can be provided before, during, and after method 500, and some of the steps described can be moved, replaced, or eliminated for additional embodiments of method 500.

As described, the devices fabricated according to methods described here include several features. For example, the source vias and drain vias have different profiles; source vias have a size greater than the drain vias. For example, the drain vias have a size greater than the gate vias. Moreover, the gate via has a dimension smaller than the width dimension of the gate stacks it situates on. An interface between the gate via and the gate stack spaces away from the gate spacers, and therefore, spaces away from source contacts and drain contacts. These features provide various benefits to the devices. For example, lower via resistances may be achieved in the source nodes, along with lower capacitances in the drain node. Accordingly, the device speeds are improved. Moreover, the gate vias may be designed to locate anywhere along the gate stacks such that there may be less restrictions to routing the metal lines. As a result, routing efficiency increases, which improves the chip density without adversely affecting the performances. Additionally, these methods are compatible with existing processing flow and little to no extra cost is required to achieve the aforementioned benefits.

The present disclosure provides for many different embodiments. One general aspect includes a semiconductor device. The semiconductor device includes a substrate having a top surface, a fin structure on the substrate extending lengthwise along a first direction, a source feature and a drain feature formed on the fin structure, a gate structure having a gate stack on the substrate extending along a second direction perpendicular to the first direction and interposing between the source feature and the drain feature, a gate via directly disposed on the gate stack, a source via electrically connecting the source feature, and a drain via electrically connecting the drain feature. The fin structure includes a stack of channel layers, and the gate stack engages with the stack of channel layers. The source via has a first dimension along the second direction and a second dimension along the first direction, the drain via feature has a third dimension along the second direction and a fourth dimension along the first direction. A ratio of the first dimension to the second dimension is greater than a ratio of the third dimension to the fourth dimension.

In some embodiments, the gate via has a first area on a cross-section parallel to the top surface, the source via has a second area on the cross-section, the drain via has a third area on the cross-section. The first area is less than the third area, and the third area is less than the second area. In some embodiments, a ratio of the second area to the third area is about 1.15:1 to about 10:1, and a ratio of the third area to the first area is about 1.1:1 to about 3:1. In some embodiments, the source via electrically connects the source feature to a first metal line, and the drain via electrically connects the drain feature to a second metal line. The first metal line has a first line width along the second direction, and the second line has a second line width along the second direction. A ratio of the first line width to the second line width is about 1.3:1 to about 10:1. In some embodiments, a projection of the gate via onto the fin structure along a vertical direction overlaps with a boundary of the fin structure, where the vertical direction is perpendicular to the top surface. In some embodiments, a projection of the gate via onto the fin structure along a vertical direction is within a boundary of the fin structure, where the vertical direction is perpendicular to the top surface. In some embodiments, the fin structure is a first fin structure and the gate via is a first gate via. Moreover, the semiconductor device further includes a second fin structure and a second gate via. A projection of the second gate via onto the second fin structure along the vertical direction is outside a boundary of the second fin structure. In some embodiments, the gate via has a fifth dimension along the second direction and a sixth dimension along the first direction. The fifth dimension is less than the third dimension and the sixth dimension is less than the fourth dimension. Moreover, the ratio of the first dimension to the second dimension is greater than a ratio of the fifth dimension to the sixth dimension. Furthermore, the gate stack has a gate stack width along the first direction, and the gate stack width is greater than the sixth dimension. In some embodiments, the fin structure is a first fin structure. Moreover, the semiconductor device further includes a second fin structure. The gate via has a first projection along a vertical direction onto a cross-section parallel to the top surface, the first fin structure has a second projection along the vertical direction onto the cross-section, and the second fin structure has a third projection along the vertical direction onto the cross-section. The first projection overlaps with one of the second projection and the third projection. In some embodiments, the semiconductor device further includes a source contact electrically connecting the source via to the source feature, a drain contact electrically connecting the drain via to the drain feature; and a dielectric feature on and directly contacting a top surface of the gate stack. The dielectric feature has a first portion extending from a sidewall of the source contact to a first sidewall of the gate stack. Moreover, the dielectric feature further has a second portion extending from a sidewall of the drain contact to a second sidewall of the gate stack. The first sidewall of the gate stack and the second sidewall of the gate stack each extend from within the top surface of the gate stack. In some embodiments, the fin structure, the source feature, the drain feature, and the drain via are within a first memory cell. The semiconductor device further includes a second memory cell including another source feature. The source via electrically connects the source feature and electrically connects the another source feature. The source via is formed on a boundary between the first memory cell and the second memory cell. In some embodiments, a ratio of the first dimension to the second dimension is about 1.2:1 to about 10:1.

One general aspect includes a semiconductor device. The semiconductor device includes a substrate, a gate structure on the substrate extending along a gate direction, a source feature, a drain feature on opposing sides of the gate structure, a set of semiconductor layers between the source feature and the drain feature and engaging with the gate structure. The gate structure has a gate stack and gate spacers on both sides of the gate stack. The semiconductor device also includes a source via electrically connecting the source feature, a drain via electrically connecting the drain feature, and a gate via formed on and directly contacting the gate stack. An interface between the gate via and the gate structure is spaced away from the gate spacers. The source via has a first surface area at an interface with a first metal line. The drain via has a second surface area at an interface with a second metal line. The gate via has a third surface area at an interface with a third metal line. The first surface area is greater than the second surface area, and the second surface area is greater than the third surface area.

In some embodiments, a ratio of the first surface area to the second surface area is about 1.15:1 to about 10:1. And a ratio of the second surface area to the third surface area is about 1.1:1 to about 3:1. In some embodiments, the semiconductor device further includes an interlayer dielectric (ILD) layer. The source via, the drain via, and the gate via are each embedded within the ILD layer. Each of the source via, the drain via, and the gate via includes a first interface with the ILD layer and a second interface with the ILD layer, where the second interface is opposite to the first interface. Moreover, each of the source via, the drain via, and the gate via includes a same conductive material composition extending from the first interface to the second interface. In some embodiments, the source via, the drain via, and the gate via are each formed of ruthenium (Ru).

One general aspect includes a method. The method includes receiving a semiconductor workpiece. The semiconductor workpiece includes a stack of channel layers, a source feature and a drain feature on opposing sides of the stack of channel layers, and a gate structure interposing between the source feature and the drain feature. The gate structure includes a gate stack and gate spacers on opposing sides of the gate stack. The gate stack engages with the stack of channel layers. The method also includes forming a source contact on the source feature and a drain contact on the drain feature, forming a source via on the source contact and a drain via on the drain contact, and forming a gate via on the gate structure. The forming of the gate via includes forming each sidewall of the gate via on and intersecting with a top surface of the gate stack.

In some embodiments, the forming of the gate via includes forming the gate via over the stack of channel layers. In some embodiments, the gate via is a first gate via, the gate structure is a first gate structure, and the stack of channel layers is a first stack of channel layers. The semiconductor workpiece includes a second stack of channel layers and a second gate structure engaged with the second stack of channel layers, where the second stack of channel layers has a top surface extending along a first plane. The method further includes forming a second gate via on the second gate structure. The second gate via has a projection onto the first plane, where the projection of the second gate via overlaps with a boundary of the second stack of channel layers. In some embodiments, the forming of the source via includes forming the source via having an aspect ratio of about 1.2:1 to about 10:1. Moreover, the forming of the drain via includes forming the drain via having an aspect ratio of about 1.2:1 to about 1:1.2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a stack of channel layers disposed over the substrate and extending lengthwise along a first direction;
   a source feature and a drain feature disposed over the substrate, wherein the stack of channel layers extend between the source feature and the drain feature;
   a gate structure disposed over the substrate and extending along a second direction perpendicular to the first direction, wherein the gate structure is disposed between the source feature and the drain feature and the gate structure has a gate stack that engages the stack of channel layers;
   a gate via disposed directly on the gate stack;
   a source via connected to the source feature; and
   a drain via connected to the drain feature, wherein:
     the source via has a first dimension along the second direction and a second dimension along the first direction,
     the drain via has a third dimension along the second direction and a fourth dimension along the first direction,
     a ratio of the first dimension to the second dimension is greater than a ratio of the third dimension to the fourth dimension,
     the gate via has a fifth dimension along the second direction and a sixth dimension along the first direction,
     the fifth dimension is less than the third dimension and the sixth dimension is less than the fourth dimension,
     the ratio of the first dimension to the second dimension is greater than a ratio of the fifth dimension to the sixth dimension, and
     the gate stack has a gate stack width along the first direction, wherein the gate stack width is greater than the sixth dimension.

2. The semiconductor device of claim 1, wherein:
   the gate via has a first top cross-sectional area;
   the source via has a second top cross-sectional area;
   the drain via has a third top cross-sectional area;
   the first top cross-sectional area is less than the third top cross-sectional area; and
   the third top cross-sectional area is less than the second top cross-sectional area.

3. The semiconductor device of claim 2, wherein:
   a ratio of the second top cross-sectional area to the third top cross-sectional area is about 1.15:1 to about 10:1, and
   a ratio of the third top cross-sectional area to the first top cross-sectional area is about 1.1:1 to about 3:1.

4. The semiconductor device of claim 1, further comprising:
   a first metal line having a first line width along the second direction, wherein:
     the source via is connected to the first metal line, and
     the source via is disposed between the source feature and the first metal line; and
   a second metal line having a second line width along the second direction, wherein:
     the drain via is connected to the second metal line,
     the drain via is disposed between the drain feature and the second metal line, and
     a ratio of the first line width to the second line width is about 1.3:1 to about 10:1.

5. The semiconductor device of claim 1, wherein the gate via overlaps an edge of the stack of channel layers.

6. The semiconductor device of claim 1, wherein the gate via overlaps the stack of channel layers.

7. The semiconductor device of claim 6, wherein:
   the stack of channel layers is a first stack of channel layers, the gate via is a first gate via,
the semiconductor device further comprises a second stack of channel layers and a second gate via, and
the second gate via does not overlap the second stack of channel layers.

8. The semiconductor device of claim 1, wherein:
the ratio of the first dimension to the second dimension is about 1.2 to about 10; and
the ratio of the third dimension to the fourth dimension is about 1 to about 1.2.

9. The semiconductor device of claim 1, wherein:
the stack of channel layers is a first stack of channel layers,
the semiconductor device further comprises a second stack of channel layers, and
the gate via overlaps one of the first stack of channel layers or the second stack of channel layers.

10. The semiconductor device of claim 1, further comprising:
a source contact disposed between and connecting the source via to the source feature, wherein the source contact extends along the second direction; and
a drain contact disposed between and connecting the drain via to the drain feature, wherein the drain contact extends along the second direction.

11. The semiconductor device of claim 1, wherein:
the stack of channel layers, the source feature, the drain feature, and the drain via are within a first memory cell,
the source feature is a first source feature,
the semiconductor device further comprises a second memory cell comprising a second source feature,
the source via is connected to the source feature and the second source feature, and
the source via is disposed over a boundary between the first memory cell and the second memory cell.

12. The semiconductor device of claim 1, wherein the ratio of the first dimension to the second dimension is about 1.2:1 to about 10:1.

13. A semiconductor device, comprising:
a substrate;
a first gate structure and a second gate structure on the substrate extending along a gate direction, wherein each of the first gate structure and the second gate structure has a respective gate stack and respective gate spacers along sidewalls of the respective gate stack;
a first source feature, a second source feature, and a common drain feature, wherein the first gate structure is disposed between the first source feature and the common drain feature and the second gate structure is disposed between the common drain feature and the second source feature;
first semiconductor layers disposed between the first source feature and the common drain feature, wherein the first gate structure wraps the first semiconductor layers;
second semiconductor layers disposed between the common drain feature and the second source feature, wherein the second gate structure wraps the second semiconductor layers;
a first source via connected to the first source feature;
a second source via connected to the second source feature;
a drain via connected to the common drain feature;
a first gate via connected to the respective gate stack of the first gate structure; and
a second gate via connected to the respective gate stack of the second gate structure;
wherein:
each of the first source via and the second source via has a first top surface area,
the drain via has a second top surface area,
each of the first gate via and the second gate via has a third top surface area,
the first top surface area is greater than the second top surface area,
the second top surface area is greater than the third top surface area,
the first gate via is disposed directly over and overlaps the first semiconductor layers, and
the second gate via is directly disposed over an isolation region and does not overlap the second semiconductor layers.

14. The semiconductor device of claim 13, wherein:
a ratio of the first top surface area to the second top surface area is about 1.15:1 to about 10:1, and
a ratio of the second top surface area to the third top surface area is about 1.1:1 to about 3:1.

15. The semiconductor device of claim 13, further comprising:
a first source contact and a second source contact, wherein:
the first source contact is disposed between the first source via and the first source feature,
the second source contact is disposed between the second source via and the second source feature, and
the first source contact and the second source contact extend lengthwise along the gate direction; and
a drain contact, wherein;
the drain contact is disposed between the drain via and the common drain feature, and
the drain contact extends lengthwise along the gate direction.

16. The semiconductor device of claim 13, wherein the first source via, the second source via, the drain via, the first gate via, and the second gate via are ruthenium (Ru) vias.

17. The semiconductor device of claim 13, wherein the first source via has a first dimension along the gate direction and a second dimension along a first direction perpendicular to the gate direction.

18. The semiconductor device of claim 17, wherein the drain via has a third dimension along the gate direction and a fourth dimension along the first direction.

19. The semiconductor device of claim 18, wherein a ratio of the first dimension to the second dimension is greater than a ratio of the third dimension to the fourth dimension.

20. The semiconductor device of claim 18, wherein:
the gate via has a fifth dimension along the gate direction and a sixth dimension along the first direction, and
the fifth dimension is less than the third dimension and the sixth dimension is less than the fourth dimension.

* * * * *